(12) United States Patent
Shen et al.

(10) Patent No.: US 10,685,954 B1
(45) Date of Patent: Jun. 16, 2020

(54) SILICON CONTROLLED RECTIFIER

(71) Applicant: AMAZING MICROELECTRONIC CORP., New Taipei (TW)

(72) Inventors: Yu-Shu Shen, Chiayi County (TW); Pin-Hui Lee, Tainan (TW)

(73) Assignee: Amazing Microelectronic Corp., New Taipei (TW)

( * ) Notice: Subject to any disclaimer, the term of this patent is extended or adjusted under 35 U.S.C. 154(b) by 0 days.

(21) Appl. No.: 16/202,297

(22) Filed: Nov. 28, 2018

(51) Int. Cl.
*H01L 27/02* (2006.01)
*H01L 29/74* (2006.01)
*H01L 29/417* (2006.01)
*H01L 29/06* (2006.01)

(52) U.S. Cl.
CPC ...... *H01L 27/0251* (2013.01); *H01L 29/0692* (2013.01); *H01L 29/41716* (2013.01); *H01L 29/74* (2013.01)

(58) Field of Classification Search
CPC .............. H01L 27/0251; H01L 29/0692; H01L 29/41716; H01L 29/74
USPC ......................................................... 257/111
See application file for complete search history.

(56) References Cited

U.S. PATENT DOCUMENTS

| | | | |
|---|---|---|---|
| 5,343,053 A * | 8/1994 | Avery | H01L 27/0259 257/173 |
| 5,856,214 A | 1/1999 | Yu | |
| 6,246,079 B1 * | 6/2001 | Chen | H01L 27/0262 257/109 |
| 9,691,753 B2 | 6/2017 | Zhong et al. | |
| 2004/0178455 A1 * | 9/2004 | Kojima | H01L 27/0262 257/371 |
| 2009/0278168 A1 * | 11/2009 | Hwang | H01L 27/0262 257/173 |
| 2011/0133247 A1 | 6/2011 | Sarbishaei et al. | |
| 2012/0205714 A1 * | 8/2012 | Salcedo | H01L 21/8222 257/140 |
| 2015/0091054 A1 * | 4/2015 | Su | H01L 27/0629 257/140 |

* cited by examiner

*Primary Examiner* — Igwe U Anya
(74) *Attorney, Agent, or Firm* — Rosenberg, Klein & Lee

(57) ABSTRACT

A silicon controlled rectifier includes a P-type substrate, an N-type doped well, a first P-type strip-shaped heavily-doped area arranged in the N-type doped well, a first N-type strip-shaped heavily-doped area arranged in the P-type substrate, and at least one N-type heavily-doped area arranged in the P-type substrate and the N-type doped well. The at least one N-type heavily-doped area is not arranged between the first P-type strip-shaped heavily-doped area and the first N-type strip-shaped heavily-doped area, thus the surface area of a semiconductor substrate can be reduced. The conductivity types of the abovementioned components are alternatively changed.

19 Claims, 27 Drawing Sheets

SILICON CONTROLLED RECTIFIER

BACKGROUND OF THE INVENTION

Field of the Invention

The present invention relates to a rectifier, particularly to a silicon controlled rectifier that reduces the surface area of a semiconductor substrate.

Description of the Related Art

As the IC device sizes have been shrunk to nanometer scale, the consumer electronics, like the laptop and mobile devices, have been designed to be much smaller than ever. Without suitable protection devices, the functions of these electronics could be reset or even damaged under electrostatic discharge (ESD) events. Currently, all consumer electronics are expected to pass the ESD test requirement of IEC 61000-4-2 standard. Transient voltage suppressor (TVS) is generally designed to bypass the ESD energy, so that the electronic systems can be prevented from ESD damages.

The working principle of TVS is shown in FIG. 1. In FIG. 1, the TVS device 10 is connected in parallel with the protected circuit 12 on the printed circuit board (PCB). The TVS device 10 would be triggered immediately when the ESD event occurs. In that way, the TVS device 10 can provide a superiorly low resistance path for discharging the transient ESD current, so that the energy of the ESD transient current can be bypassed by the TVS device 10. Silicon-controlled rectifier (SCR) devices exhibit strong ESD robustness and strong current discharge capacity per unit area. SCR devices are widely used as on-chip structures for electrostatic discharge (ESD) protection. When the on-chip structures are integrated in a low-operating power source IC device, the high triggering voltage of an SCR device faces limitations in the range of applications. Therefore, some advanced techniques, such as Zener diode triggered SCR (alternatively referred to as Zener-triggered SCR) devices have been proposed to enhance the ESD efficiency. However, conventional Zener-triggered SCR devices consume a large silicon real estate. Conventional SCR devices also face the problems of lower current discharge capacity per unit area.

To overcome the abovementioned problems, the present invention provides a silicon controlled rectifier, so as to solve the afore-mentioned problems of the prior art.

SUMMARY OF THE INVENTION

A primary objective of the present invention is to provide a silicon controlled rectifier, which arranges at least one N-type heavily-doped area or at least one P-type heavily-doped area outside a first P-type strip-shaped heavily-doped area and a first N-type strip-shaped heavily-doped area to reduce the surface area of a semiconductor substrate and enhance the electrostatic discharge (ESD) efficiency.

To achieve the abovementioned objectives, the present invention provides a silicon controlled rectifier, which comprises a P-type substrate, a N-type doped well arranged in the P-type substrate, a first P-type strip-shaped heavily-doped area arranged in the N-type doped well, a first N-type strip-shaped heavily-doped area arranged in the P-type substrate, a second P-type strip-shaped heavily-doped area arranged in the P-type substrate, and at least one N-type heavily-doped area arranged in the P-type substrate and the N-type doped well. The first N-type strip-shaped heavily-doped area is arranged in parallel to the first P-type strip-shaped heavily-doped area. The second P-type strip-shaped heavily-doped area is arranged in the P-type substrate and arranged in parallel to the first N-type strip-shaped heavily-doped area. The at least one N-type heavily-doped area is arranged outside the first P-type strip-shaped heavily-doped area and the first N-type strip-shaped heavily-doped area and closer to the first P-type strip-shaped heavily-doped area rather than the first N-type strip-shaped heavily-doped area, and the at least one N-type heavily-doped area is not arranged between the first P-type strip-shaped heavily-doped area and the first N-type strip-shaped heavily-doped area. The first P-type strip-shaped heavily-doped area is coupled to an anode, and the first N-type strip-shaped heavily-doped area and the second P-type strip-shaped heavily-doped area are coupled to a cathode.

In an embodiment of the present invention, the P-type substrate is a P-type lightly-doped substrate and the N-type doped well is an N-type lightly-doped well.

In an embodiment of the present invention, the at least one N-type heavily-doped area further comprises two N-type heavily-doped areas.

In an embodiment of the present invention, the second P-type strip-shaped heavily-doped area contacts the first N-type strip-shaped heavily-doped area.

In an embodiment of the present invention, the silicon controlled rectifier further comprises a second N-type strip-shaped heavily-doped area coupled to the anode and arranged in the N-type doped well and arranged in parallel to the first P-type strip-shaped heavily-doped area, and the at least one N-type heavily-doped area is closer to the second N-type strip-shaped heavily-doped area rather than the first N-type strip-shaped heavily-doped area.

In an embodiment of the present invention, the first P-type strip-shaped heavily-doped area contacts the second N-type strip-shaped heavily-doped area.

In an embodiment of the present invention, the silicon controlled rectifier further comprises at least one P-type heavily-doped area, the at least one P-type heavily-doped area is arranged in the P-type substrate to contact the at least one N-type heavily-doped area, and the at least one N-type heavily-doped area is arranged between the at least one P-type heavily-doped area and the first P-type strip-shaped heavily-doped area.

In an embodiment of the present invention, the silicon controlled rectifier further comprises at least one P-type heavily-doped area, the at least one P-type heavily-doped area is arranged in the P-type substrate and the at least one N-type heavily-doped area, the at least one P-type heavily-doped area is deeper rather than the at least one N-type heavily-doped area, and a part of the sidewall of the at least one P-type heavily-doped area is surrounded by the at least one N-type heavily-doped area.

The present invention also provides a silicon controlled rectifier, which comprises an N-type substrate, a P-type doped well arranged in the N-type substrate, a first N-type strip-shaped heavily-doped area arranged in the P-type doped well, a first P-type strip-shaped heavily-doped area arranged in the N-type substrate, a second P-type strip-shaped heavily-doped area arranged in the P-type doped well, and at least one P-type heavily-doped area arranged in the N-type substrate and the P-type doped well. The first P-type strip-shaped heavily-doped area is arranged in parallel to the first N-type strip-shaped heavily-doped area. The second P-type strip-shaped heavily-doped area is arranged in parallel to the first N-type strip-shaped heavily-doped area. The at least one P-type heavily-doped area is arranged outside the first N-type strip-shaped heavily-doped area and the first P-type strip-shaped heavily-doped area and closer to the first N-type strip-shaped heavily-doped area and the second P-type strip-shaped heavily-doped area rather than the first P-type strip-shaped heavily-doped area, and the at least one P-type heavily-doped area is not arranged between the first N-type strip-shaped heavily-doped area and the first P-type strip-shaped heavily-doped area. The first N-type strip-shaped heavily-doped area and the second P-type strip-shaped heavily-doped area are coupled to a cathode, and the first P-type strip-shaped heavily-doped area is coupled to an anode.

In an embodiment of the present invention, the at least one P-type heavily-doped area further comprises two P-type heavily-doped areas.

In an embodiment of the present invention, the second P-type strip-shaped heavily-doped area contacts the first N-type strip-shaped heavily-doped area.

In an embodiment of the present invention, the silicon controlled rectifier further comprises a second N-type strip-shaped heavily-doped area coupled to the anode and arranged in the N-type substrate and arranged in parallel to the first P-type strip-shaped heavily-doped area.

In an embodiment of the present invention, the first P-type strip-shaped heavily-doped area contacts the second N-type strip-shaped heavily-doped area.

In an embodiment of the present invention, the silicon controlled rectifier further comprises at least one N-type heavily-doped area arranged in the N-type substrate to contact the at least one P-type heavily-doped area, and the at least one P-type heavily-doped area is arranged between the at least one N-type heavily-doped area and the first N-type strip-shaped heavily-doped area.

In an embodiment of the present invention, the silicon controlled rectifier further comprises at least one N-type heavily-doped area arranged in the N-type substrate and the at least one P-type heavily-doped area, the at least one N-type heavily-doped area is deeper rather than the at least one P-type heavily-doped area, and a part of the sidewall of the at least one N-type heavily-doped area is surrounded by the at least one P-type heavily-doped area.

Below, the embodiments are described in detail in cooperation with the drawings to make easily understood the technical contents, characteristics and accomplishments of the present invention.

DETAILED DESCRIPTION OF THE INVENTION

Figure 1:
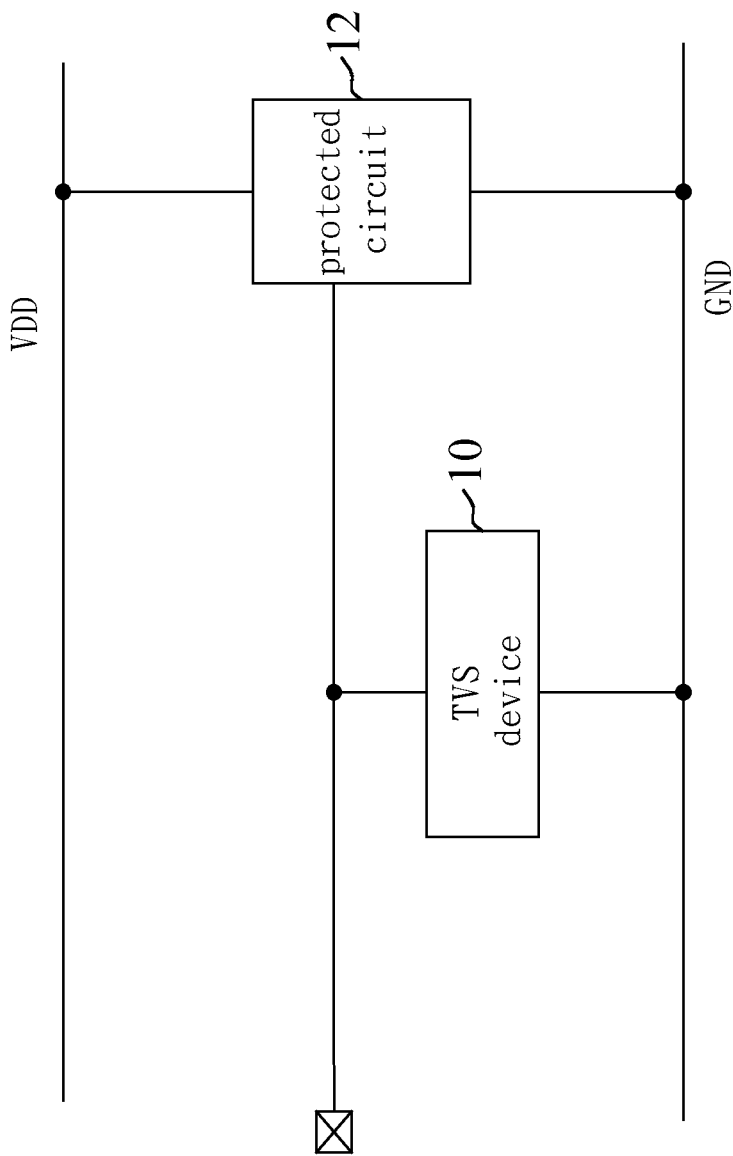
FIG. 1 is a schematic diagram illustrating a transient voltage suppressor (TVS) connected with a protected circuit.
Figure 2:
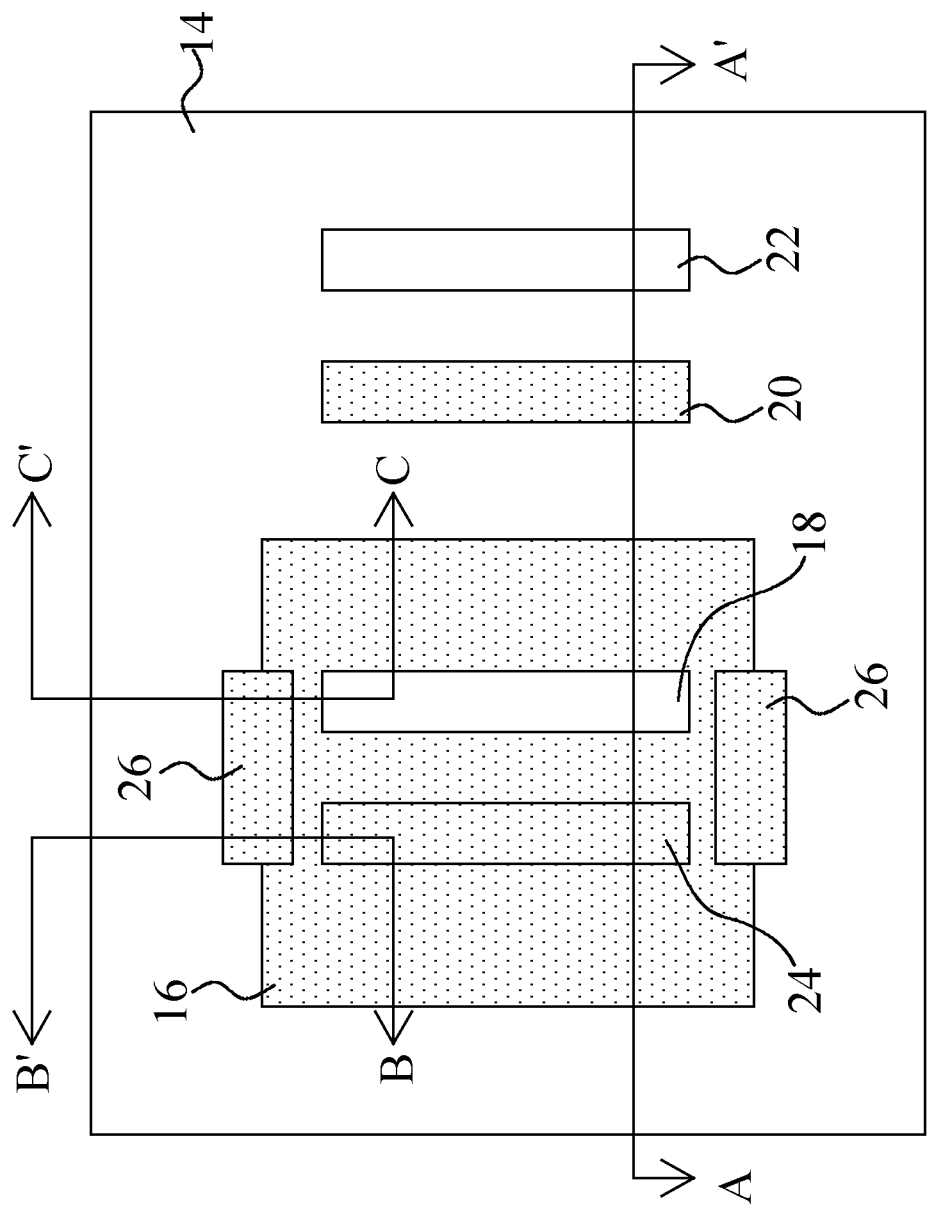
FIG. 2 is a layout schematically showing a silicon controlled rectifier according to the first embodiment of the present invention.
Figure 3:
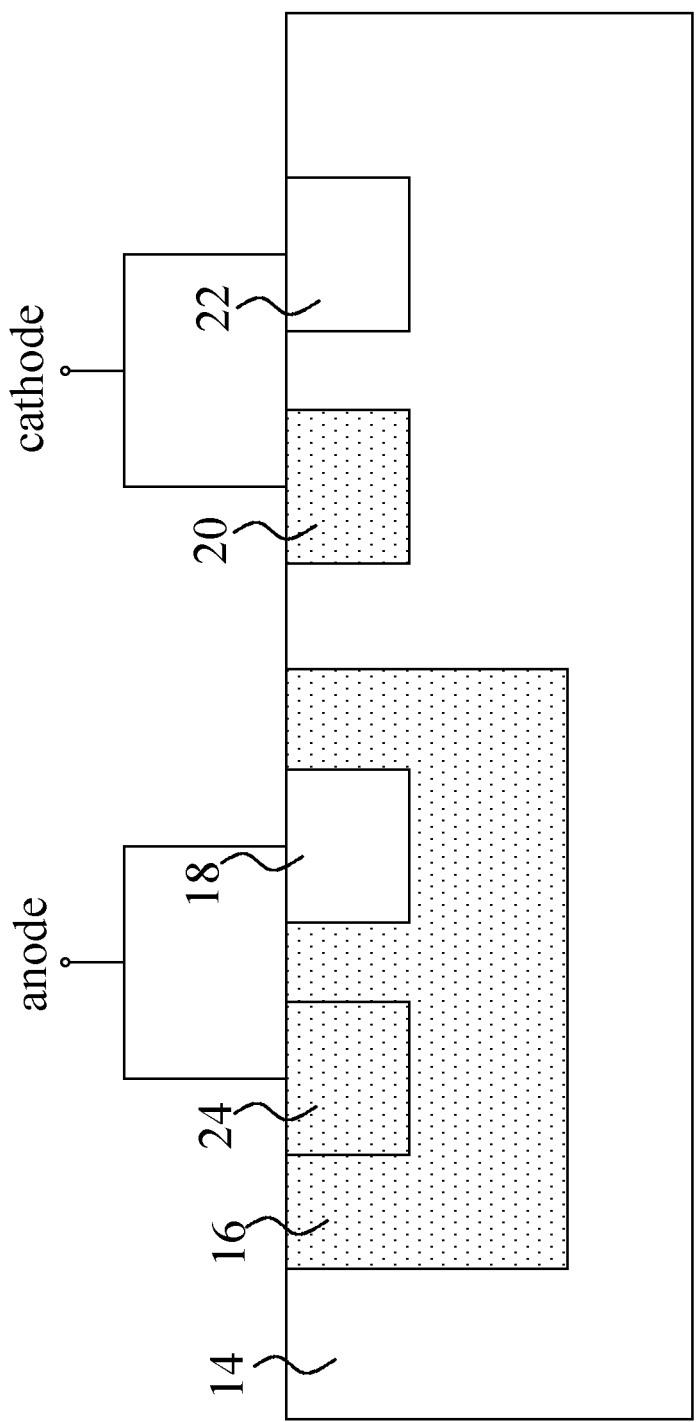
FIG. 3 is a sectional view taken along Line A-A' of FIG. 2.
Figure 4:
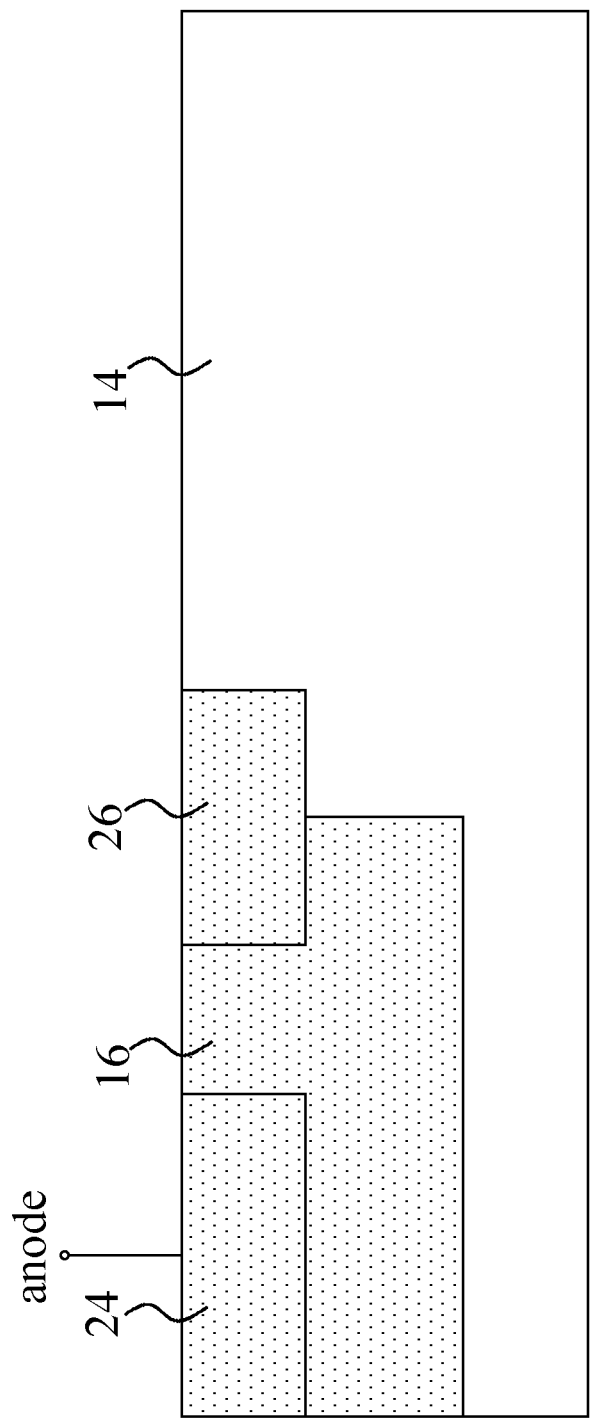
FIG. 4 is a sectional view taken along Line B-B' of FIG. 2.
Figure 5:
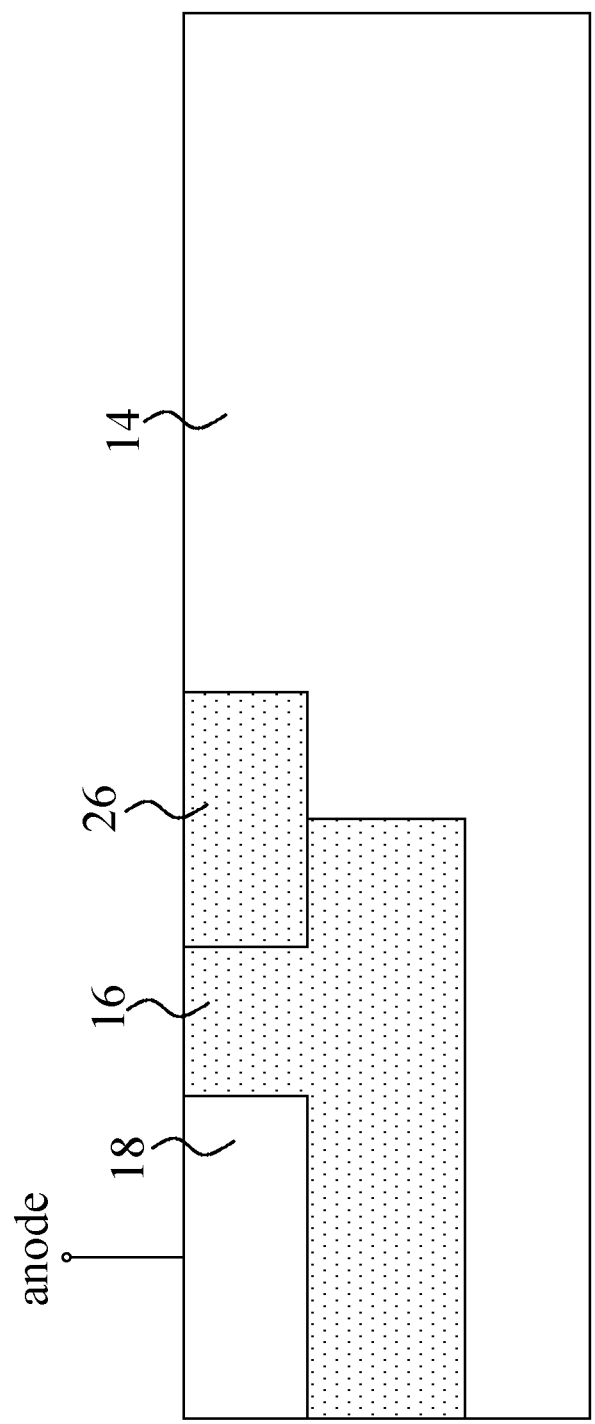
FIG. 5 is a sectional view taken along Line C-C' of FIG. 2.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Refer to FIG. 2, FIG. 3, FIG. 4, and FIG. 5. The first embodiment of a silicon controlled rectifier (SCR) is introduced as follows. The SCR comprises a P-type substrate 14, an N-type doped well 16 arranged in the P-type substrate 14, a first P-type strip-shaped heavily-doped area 18 arranged in the N-type doped well 16, a first N-type strip-shaped heavily-doped area 20 arranged in the P-type substrate 14, a second P-type strip-shaped heavily-doped area 22 arranged in the P-type substrate 14, a second N-type strip-shaped heavily-doped area 24 arranged in the N-type doped well 16, and at least one N-type heavily-doped area 26 arranged in the P-type substrate 14 and the N-type doped well 16. The first P-type strip-shaped heavily-doped area 18 and the second N-type strip-shaped heavily-doped area 24 are coupled to an anode, and the first N-type strip-shaped heavily-doped area 20 and the second P-type strip-shaped heavily-doped area 22 are coupled to a cathode. The cathode may be grounded. In the first embodiment, the number of the N-type heavily-doped area 26 is two, the P-type substrate 14 is a P-type lightly-doped substrate, and the N-type doped well 16 is an N-type lightly-doped well.

The first N-type strip-shaped heavily-doped area 20 is arranged in parallel to the first P-type strip-shaped heavily-doped area 18. The second P-type strip-shaped heavily-doped area 22 is arranged in parallel to the first N-type strip-shaped heavily-doped area 20. The second N-type strip-shaped heavily-doped area 24 is arranged in parallel to the first P-type strip-shaped heavily-doped area 18. The first P-type strip-shaped heavily-doped area 18 and the first N-type strip-shaped heavily-doped area 20 are commonly arranged between the second P-type strip-shaped heavily-doped area 22 and the second N-type strip-shaped heavily-doped area 24. The N-type heavily-doped areas 26 are arranged outside the first P-type strip-shaped heavily-doped area 18 and the first N-type strip-shaped heavily-doped area 20 and closer to the first P-type strip-shaped heavily-doped area 18 and the second N-type strip-shaped heavily-doped area 24 rather than the first N-type strip-shaped heavily-doped area 20 and the second P-type strip-shaped heavily-doped area 22. The N-type heavily-doped areas 26 are not arranged between the first P-type strip-shaped heavily-doped area 18 and the first N-type strip-shaped heavily-doped area 20. Specifically, each of the first P-type strip-shaped heavily-doped area 18, the first N-type strip-shaped heavily-doped area 20, the second P-type strip-shaped heavily-doped area 22, and the second N-type strip-shaped heavily-doped area 24 has two ends and two sidewalls. The sidewall of the first P-type strip-shaped heavily-doped area 18 faces the sidewall of the second N-type strip-shaped heavily-doped area 24. The sidewall of the first P-type strip-shaped heavily-doped area 18 faces the sidewall of the first N-type strip-shaped heavily-doped area 20. The sidewall of the first N-type strip-shaped heavily-doped area 20 faces the sidewall of the second P-type strip-shaped heavily-doped area 22. The N-type heavily-doped areas 26 are respectively closer to two ends of the first P-type strip-shaped heavily-doped area 18 rather than the sidewalls of the first P-type strip-shaped heavily-doped area 18. The N-type heavily-doped areas 26 are respectively closer to two ends of the second N-type strip-shaped heavily-doped area 24 rather than the sidewalls of the second N-type strip-shaped heavily-doped area 24. In order to increase the amount of the electrostatic discharge (ESD) current, the first P-type strip-shaped heavily-doped area 18, the first N-type strip-shaped heavily-doped area 20, the second P-type strip-shaped heavily-doped area 22, and the second N-type strip-shaped heavily-doped area 24 have to be arranged in parallel. However, in order to reduce the surface area of the P-type substrate 14, the N-type heavily-doped areas 26 are not arranged between the first P-type strip-shaped heavily-doped area 18 and the first N-type strip-shaped heavily-doped area 20, such that the surface area of the P-type substrate 14 is reduced. Due to existence of the N-type heavily-doped areas 26, the ESD efficiency of the SCR is enhanced.

The second N-type strip-shaped heavily-doped area 24 is used as an ohmic contact. Thus, the second N-type strip-shaped heavily-doped area 24 is alternatively omitted.

Figure 6:
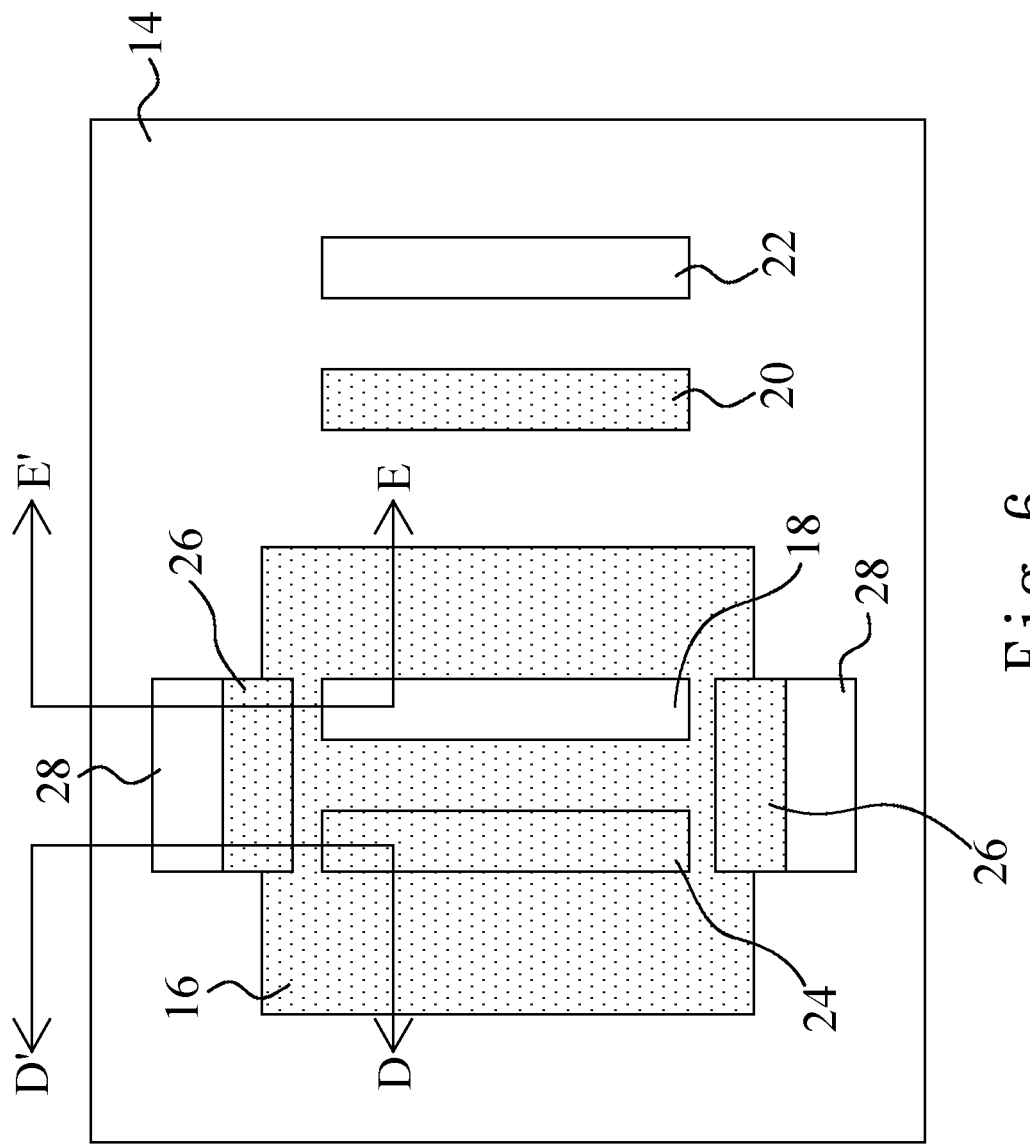
FIG. 6 is a layout schematically showing a silicon controlled rectifier according to the second embodiment of the present invention.
Figure 7:
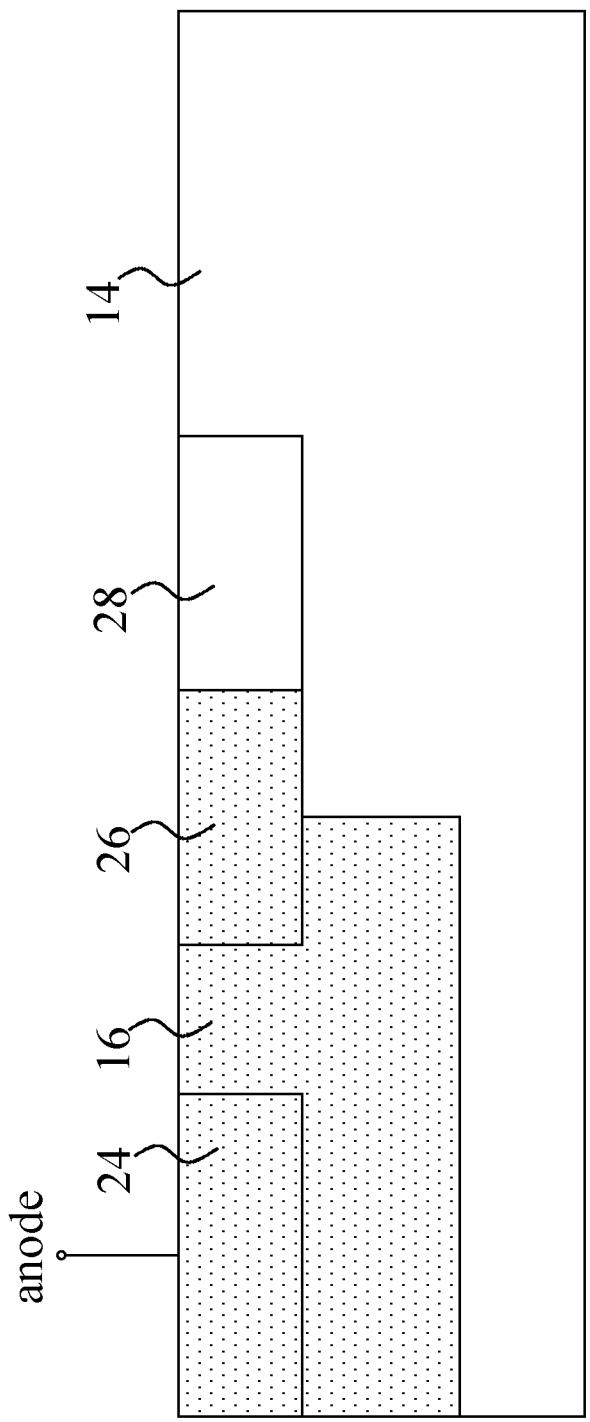
FIG. 7 is a sectional view taken along Line D-D' of FIG. 6.
Figure 8:
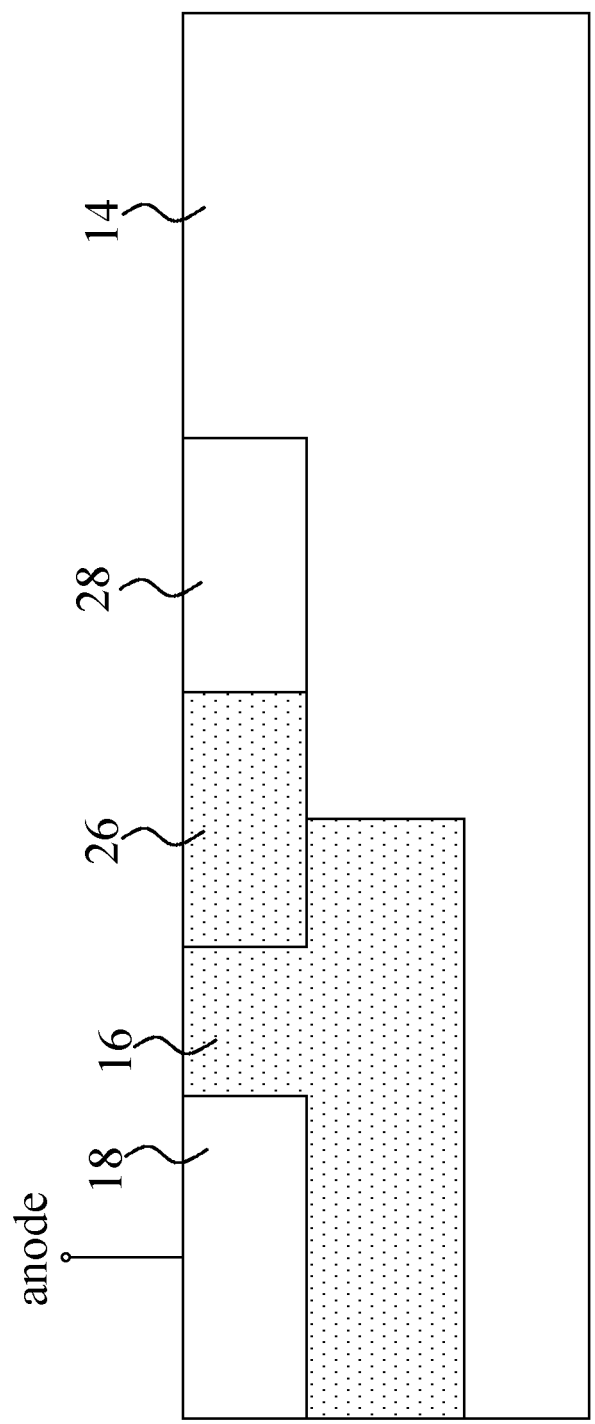
FIG. 8 is a sectional view taken along Line E-E' of FIG. 6.

Refer to FIG. 6, FIG. 7, and FIG. 8. The second embodiment of a SCR is introduced as follows. The second embodiment is different from the first embodiment in that the second embodiment further comprises at least one P-type heavily-doped area 28. In the second embodiment, the number of the P-type heavily-doped area 28 is two. The P-type heavily-doped areas 28 are arranged in the P-type substrate 14 to respectively contact the N-type heavily-doped areas 26. The N-type heavily-doped area 26 is arranged between the P-type heavily-doped area 28 and the first P-type strip-shaped heavily-doped area 18. The N-type heavily-doped area 26 is arranged between the P-type heavily-doped area 28 and the second N-type strip-shaped heavily-doped area 24. The other technical features have been described previously so will not be reiterated.

Figure 9:
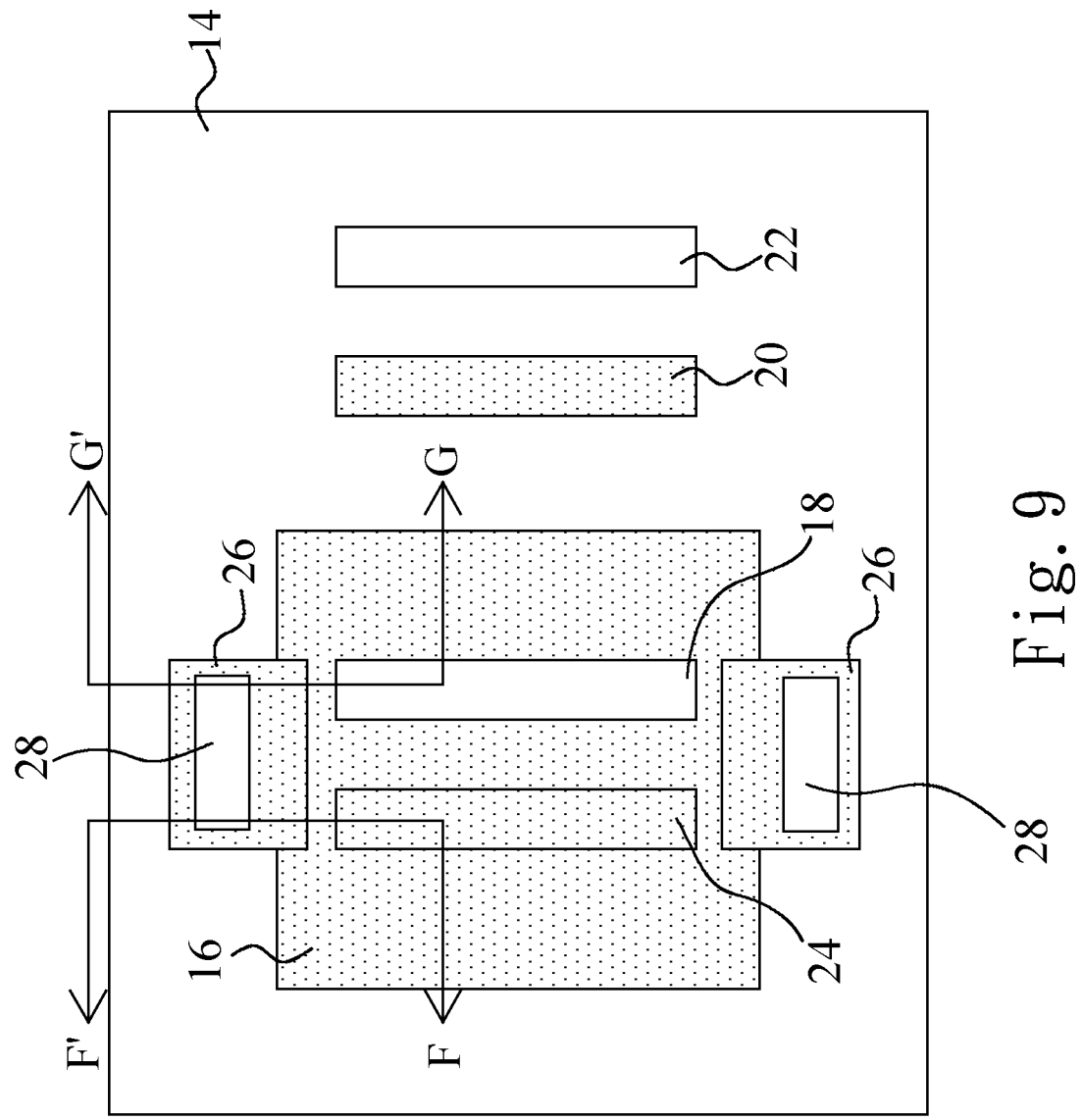
FIG. 9 is a layout schematically showing a silicon controlled rectifier according to the third embodiment of the present invention.
Figure 10:
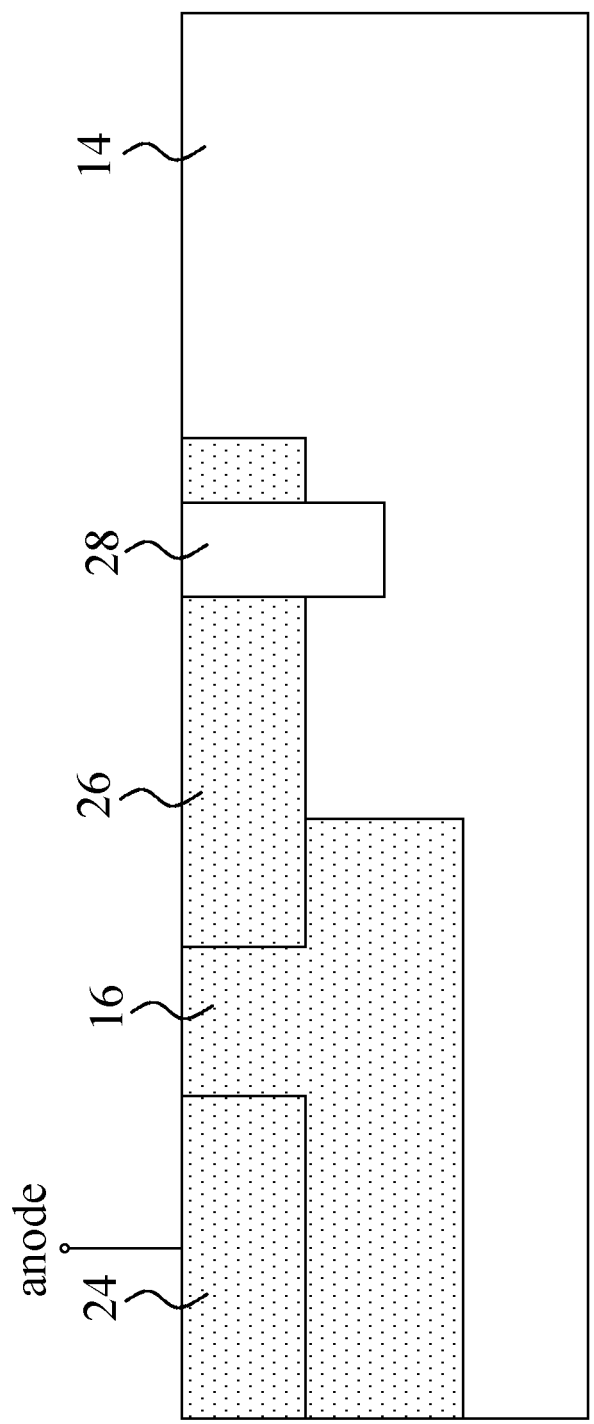
FIG. 10 is a sectional view taken along Line F-F' of FIG. 9.
Figure 11:
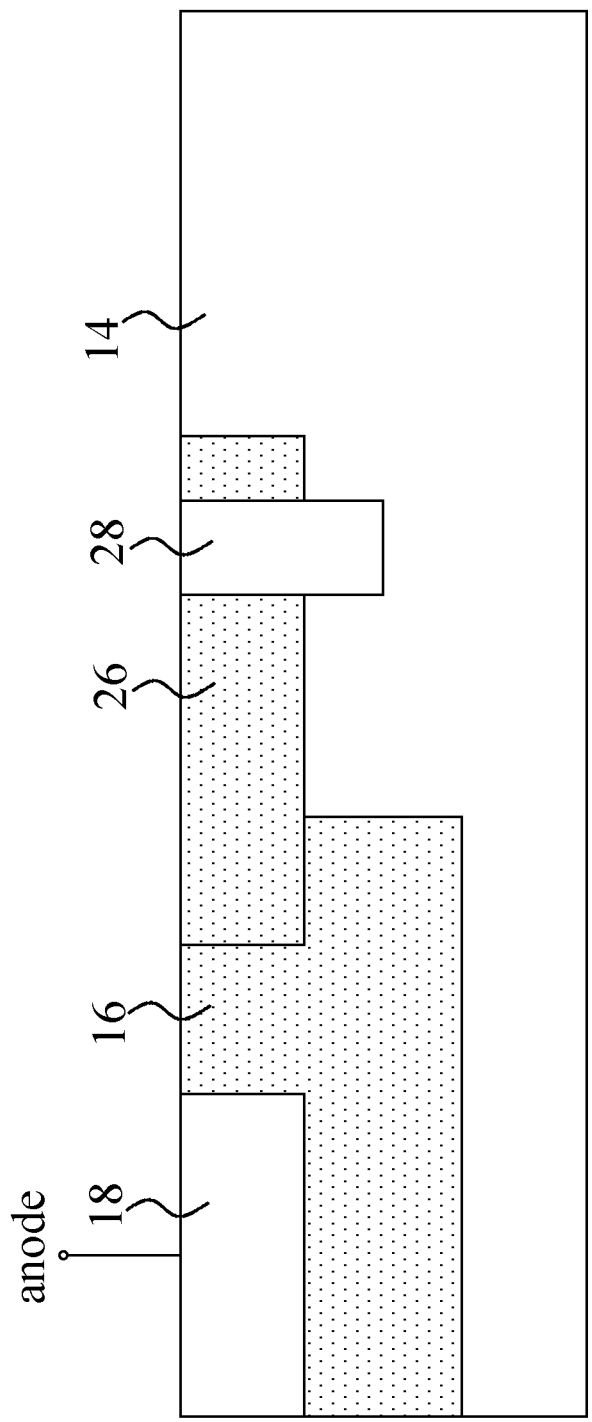
FIG. 11 is a sectional view taken along Line G-G' of FIG. 9.

Refer to FIG. 9, FIG. 10, and FIG. 11. The third embodiment of a SCR is introduced as follows. The third embodiment is different from the first embodiment in that the third embodiment further comprises at least one P-type heavily-doped area 28. In the third embodiment, the number of the P-type heavily-doped area 28 is two. The P-type heavily-doped areas 28 are arranged in the P-type substrate 14 and respectively arranged in the N-type heavily-doped areas 26, and the P-type heavily-doped areas 28 are deeper rather than the N-type heavily-doped areas 26. A part of the sidewall of the P-type heavily-doped area 28 is surrounded by the N-type heavily-doped area 26. The other technical features have been described previously so will not be reiterated.

Figure 12:
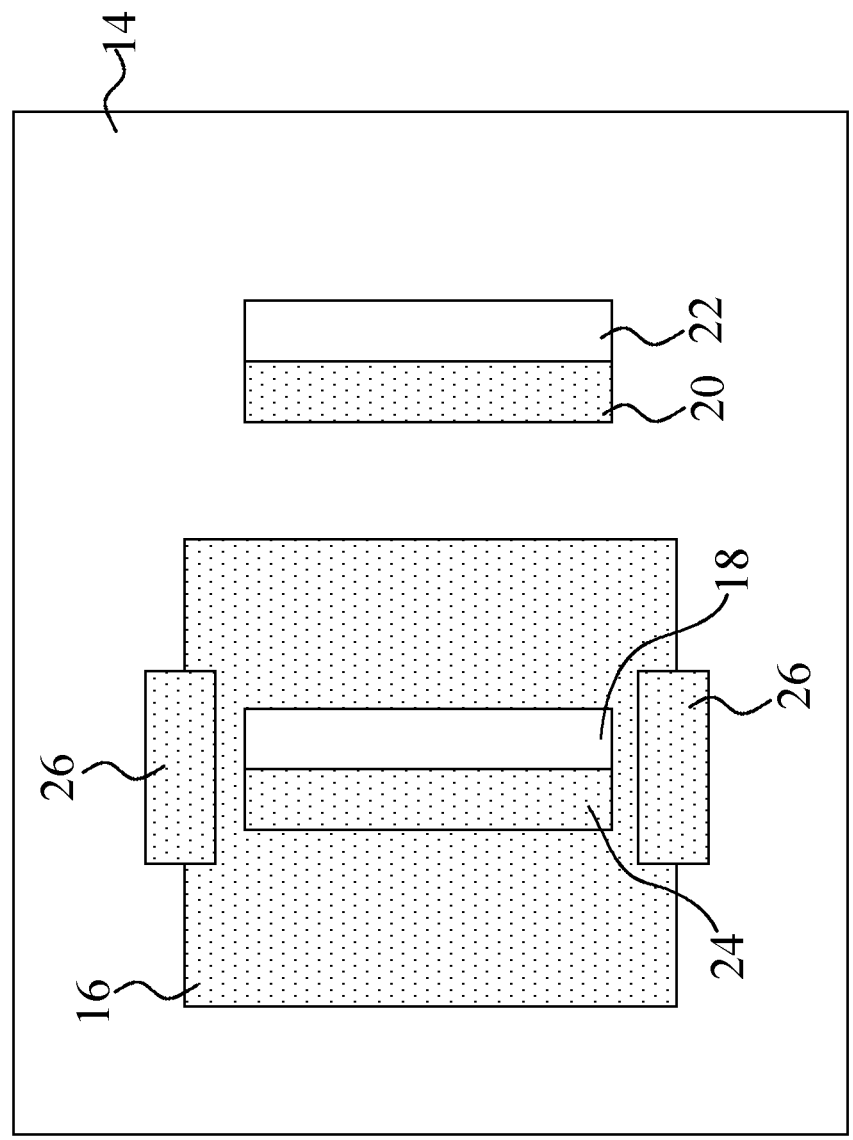
FIG. 12 is a layout schematically showing a silicon controlled rectifier according to the fourth embodiment of the present invention.

Refer to FIG. 12. The fourth embodiment of a SCR is introduced as follows. The fourth embodiment is different from the first embodiment in positions of the first P-type strip-shaped heavily-doped area 18, the first N-type strip-shaped heavily-doped area 20, the second P-type strip-shaped heavily-doped area 22, and the second N-type strip-shaped heavily-doped area 24. In the first embodiment, the first P-type strip-shaped heavily-doped area 18 and the first N-type strip-shaped heavily-doped area 20 respectively separate from the second N-type strip-shaped heavily-doped area 24 and the second P-type strip-shaped heavily-doped area 22. In the fourth embodiment, the first P-type strip-shaped heavily-doped area 18 and the first N-type strip-shaped heavily-doped area 20 respectively contact the second N-type strip-shaped heavily-doped area 24 and the second P-type strip-shaped heavily-doped area 22. The other technical features have been described previously so will not be reiterated.

Figure 13:
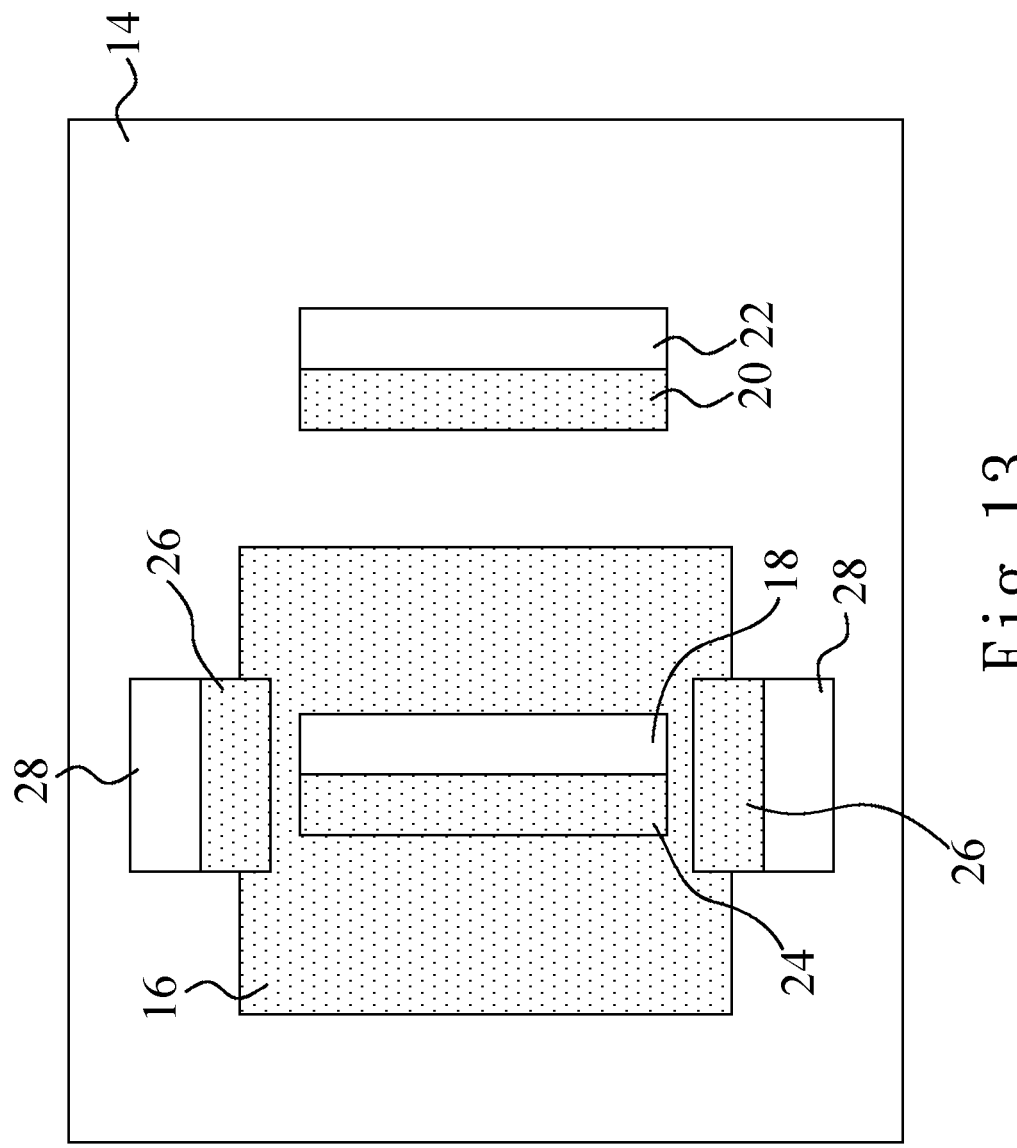
FIG. 13 is a layout schematically showing a silicon controlled rectifier according to the fifth embodiment of the present invention.

Refer to FIG. 13. The fifth embodiment of a SCR is introduced as follows. The fifth embodiment is different from the second embodiment in positions of the first P-type strip-shaped heavily-doped area 18, the first N-type strip-shaped heavily-doped area 20, the second P-type strip-shaped heavily-doped area 22, and the second N-type strip-shaped heavily-doped area 24. In the second embodiment, the first P-type strip-shaped heavily-doped area 18 and the first N-type strip-shaped heavily-doped area 20 respectively separate from the second N-type strip-shaped heavily-doped area 24 and the second P-type strip-shaped heavily-doped area 22. In the fifth embodiment, the first P-type strip-shaped heavily-doped area 18 and the first N-type strip-shaped heavily-doped area 20 respectively contact the second N-type strip-shaped heavily-doped area 24 and the second P-type strip-shaped heavily-doped area 22. The other technical features have been described previously so will not be reiterated.

Figure 14:
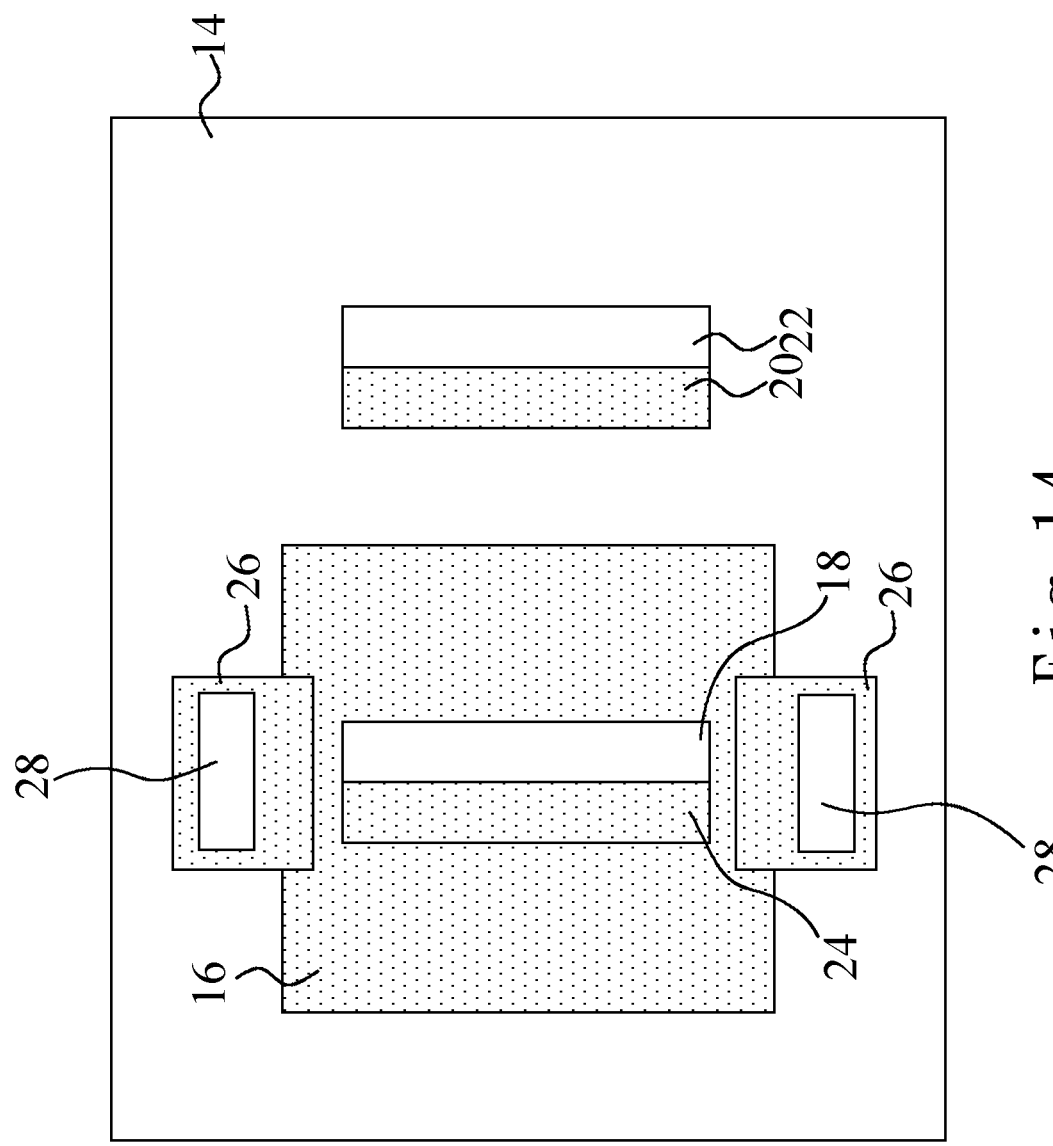
FIG. 14 is a layout schematically showing a silicon controlled rectifier according to the sixth embodiment of the present invention
Figure 15:
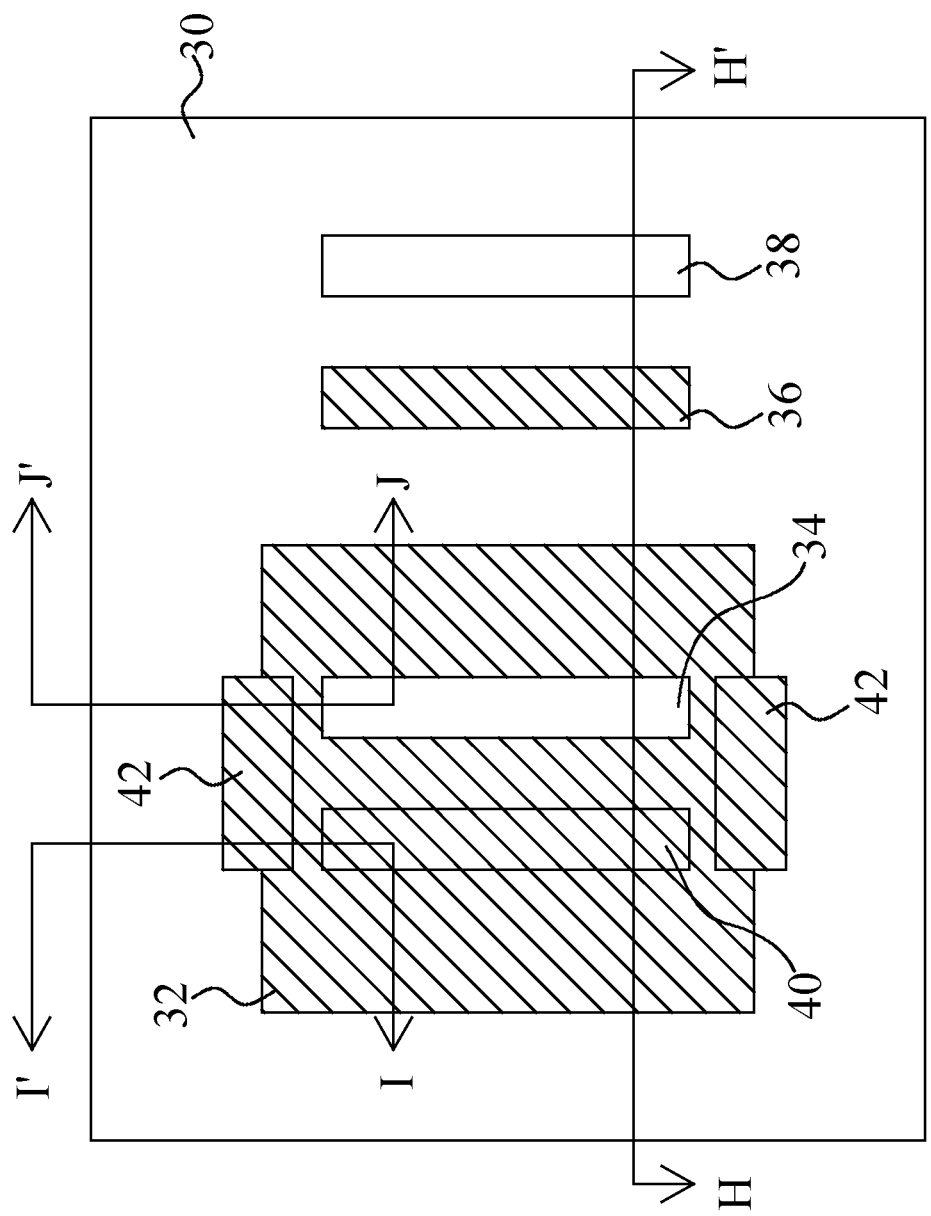
FIG. 15 is a layout schematically showing a silicon controlled rectifier according to the seventh embodiment of the present invention.
Figure 16:
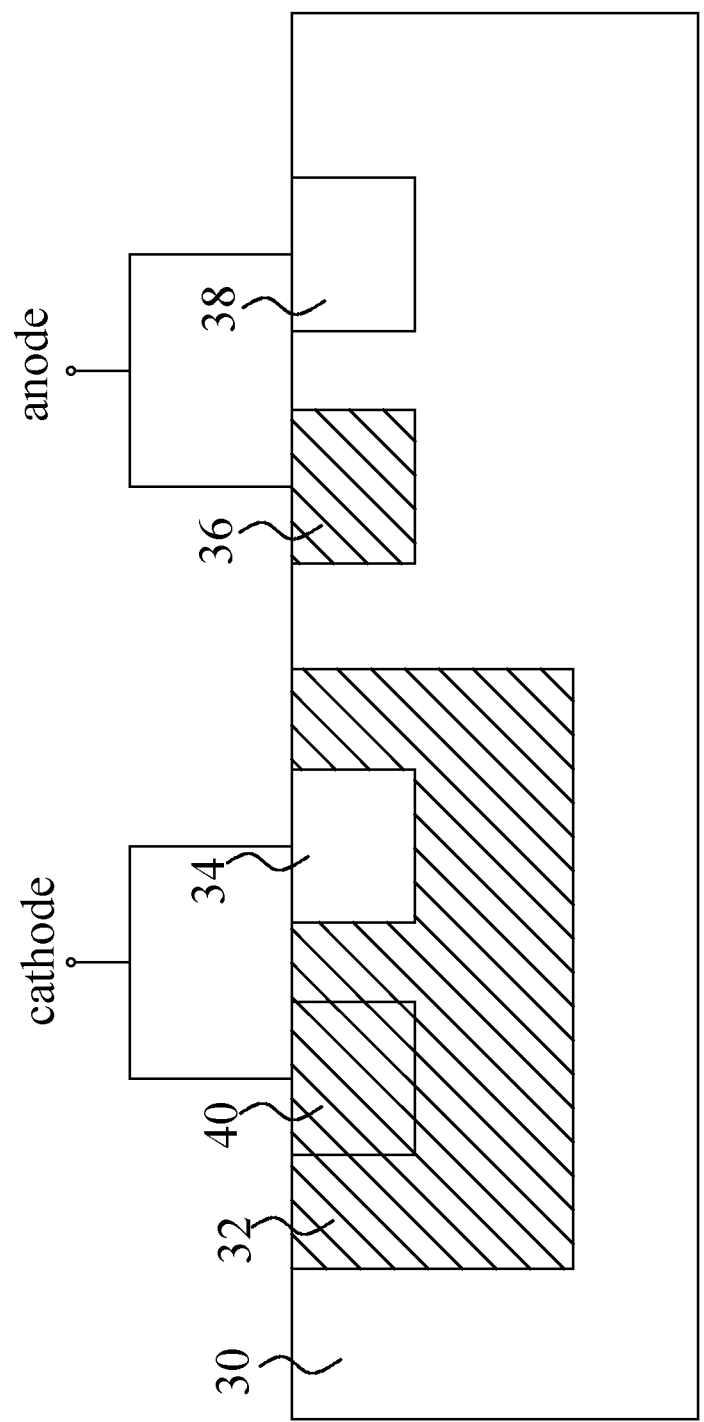
FIG. 16 is a sectional view taken along Line H-H' of FIG. 15.
Figure 17:
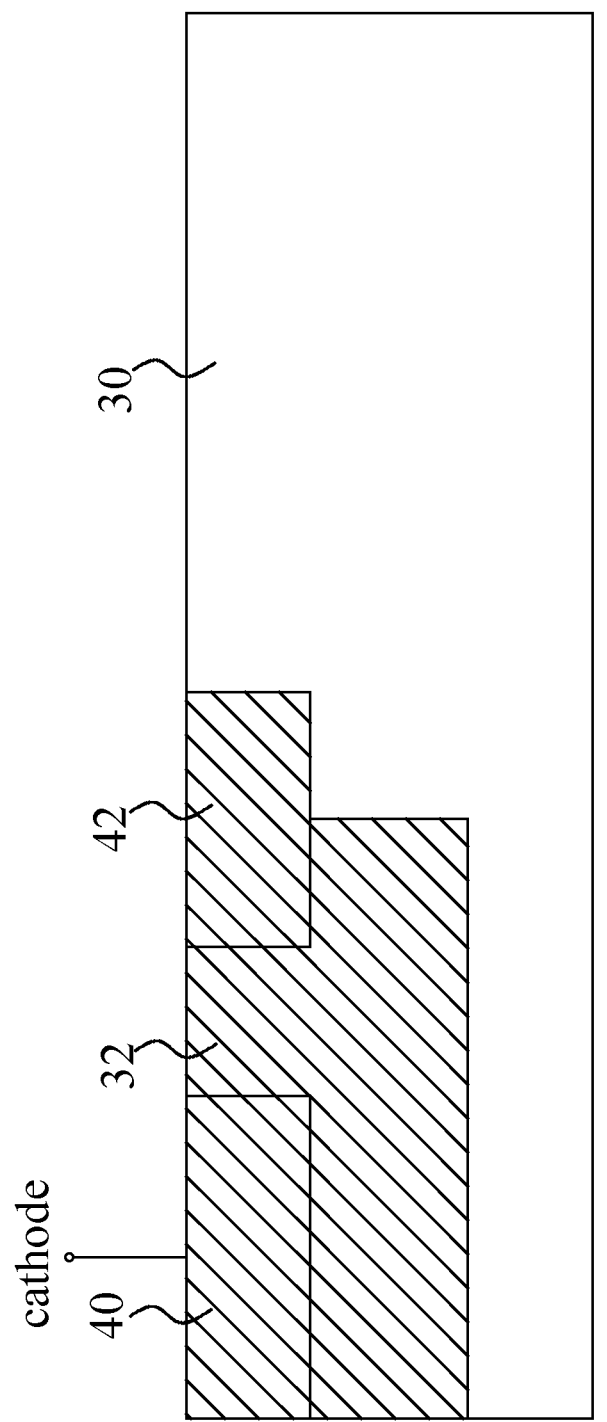
FIG. 17 is a sectional view taken along Line I-I' of FIG. 15.
Figure 18:
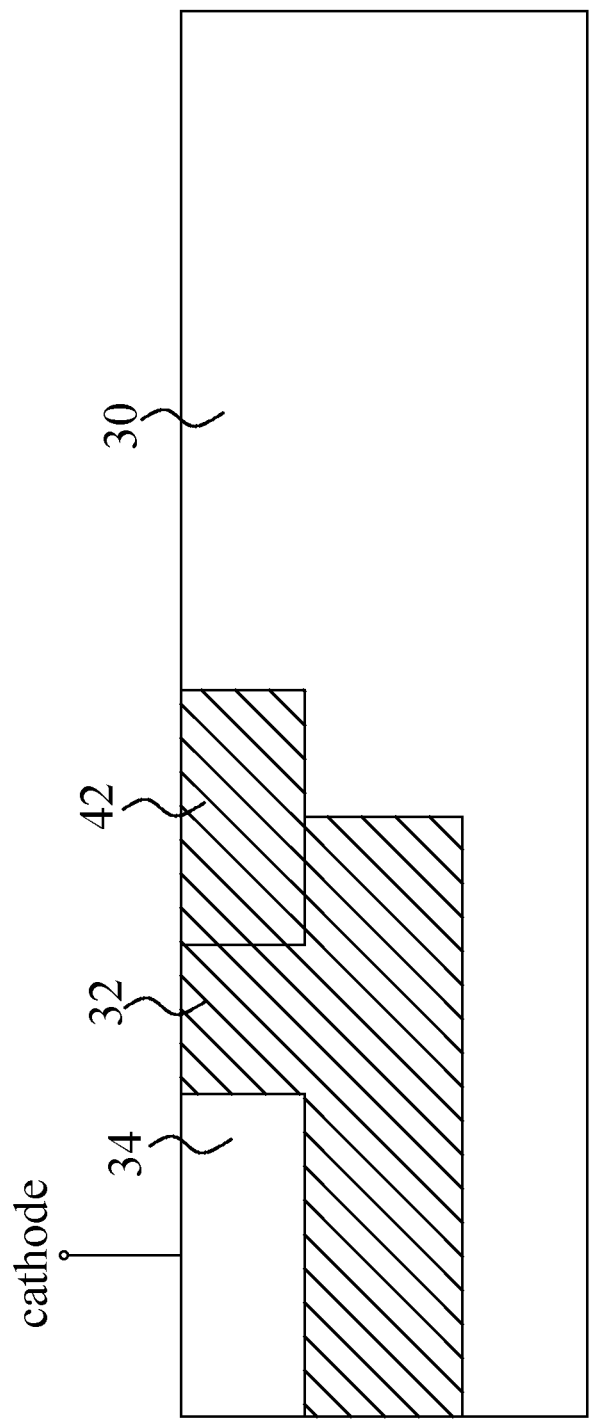
FIG. 18 is a sectional view taken along Line J-J' of FIG. 15.

Refer to FIG. 14. The sixth embodiment of a SCR is introduced as follows. The sixth embodiment is different from the third embodiment in positions of the first P-type strip-shaped heavily-doped area 18, the first N-type strip-shaped heavily-doped area 20, the second P-type strip-shaped heavily-doped area 22, and the second N-type strip-shaped heavily-doped area 24. In the third embodiment, the first P-type strip-shaped heavily-doped area 18 and the first N-type strip-shaped heavily-doped area 20 respectively separate from the second N-type strip-shaped heavily-doped area 24 and the second P-type strip-shaped heavily-doped area 22. In the sixth embodiment, the first P-type strip-shaped heavily-doped area 18 and the first N-type strip-shaped heavily-doped area 20 respectively contact the second N-type strip-shaped heavily-doped area 24 and the second P-type strip-shaped heavily-doped area 22. The other technical features have been described previously so will not be reiterated.

Refer to FIG. 15, FIG. 16, FIG. 17, and FIG. 18. The seventh embodiment of a SCR is introduced as follows. The SCR comprises an N-type substrate 30, a P-type doped well 32 arranged in the N-type substrate 30, a first N-type strip-shaped heavily-doped area 34 arranged in the P-type doped well 32, a first P-type strip-shaped heavily-doped area 36 arranged in the N-type substrate 30, a second N-type strip-shaped heavily-doped area 38 arranged in the N-type substrate 30, a second P-type strip-shaped heavily-doped area 40 arranged in the P-type doped well 32, and at least one P-type heavily-doped area 42 arranged in the N-type substrate 30 and the P-type doped well 32. The first N-type strip-shaped heavily-doped area 34 and the second P-type strip-shaped heavily-doped area 40 are coupled to a cathode, and the first P-type strip-shaped heavily-doped area 36 and the second N-type strip-shaped heavily-doped area 38 are coupled to an anode. The cathode may be grounded. In the seventh embodiment, the number of the P-type heavily-doped area 42 is two, the N-type substrate 30 is an N-type lightly-doped substrate and the P-type doped well 32 is a P-type lightly-doped well.

The first P-type strip-shaped heavily-doped area 36 is arranged in parallel to the first N-type strip-shaped heavily-doped area 34. The second P-type strip-shaped heavily-doped area 40 is arranged in parallel to the first N-type strip-shaped heavily-doped area 34. The second N-type strip-shaped heavily-doped area 38 is arranged in parallel to the first P-type strip-shaped heavily-doped area 36. The first N-type strip-shaped heavily-doped area 34 and the first P-type strip-shaped heavily-doped area 36 are commonly arranged between the second N-type strip-shaped heavily-doped area 38 and the second P-type strip-shaped heavily-doped area 40. The P-type heavily-doped areas 42 are arranged outside the first N-type strip-shaped heavily-doped area 34 and the first P-type strip-shaped heavily-doped area 36 and closer to the first N-type strip-shaped heavily-doped area 34 and the second P-type strip-shaped heavily-doped area 40 rather than the first P-type strip-shaped heavily-doped area 36 and the second N-type strip-shaped heavily-doped area 38. The P-type heavily-doped areas 42 are not arranged between the first N-type strip-shaped heavily-doped area 34 and the first P-type strip-shaped heavily-doped area 36. Specifically, each of the first N-type strip-shaped heavily-doped area 34, the first P-type strip-shaped heavily-doped area 36, the second N-type strip-shaped heavily-doped area 38, and the second P-type strip-shaped heavily-doped area 40 has two ends and two sidewalls. The sidewall of the first N-type strip-shaped heavily-doped area 34 faces the sidewall of the second P-type strip-shaped heavily-doped area 40. The sidewall of the first N-type strip-shaped heavily-doped area 34 faces the sidewall of the first P-type strip-shaped heavily-doped area 36. The sidewall of the first P-type strip-shaped heavily-doped area 36 faces the second N-type strip-shaped heavily-doped area 38. The P-type heavily-doped areas 42 are respectively closer to two ends of the first N-type strip-shaped heavily-doped area 34 rather than the sidewalls of the first N-type strip-shaped heavily-doped area 34. The P-type heavily-doped areas 42 are respectively closer to two ends of the second P-type strip-shaped heavily-doped area 40 rather than the sidewalls of the second P-type strip-shaped heavily-doped area 40. In order to increase the amount of the electrostatic discharge (ESD) current, the first N-type strip-shaped heavily-doped area 34, the first P-type strip-shaped heavily-doped area 36, the second N-type strip-shaped heavily-doped area 38, and the second P-type strip-shaped heavily-doped area 40 have to be arranged in parallel. In order to reduce the surface area of the N-type substrate 30, the P-type heavily-doped areas 42 are not arranged between the first N-type strip-shaped heavily-doped area 34 and the first P-type strip-shaped heavily-doped area 36, such that the surface area of the N-type substrate 30 is reduced. Due to existence of the P-type heavily-doped areas 42, the ESD efficiency of the SCR is enhanced.

The second N-type strip-shaped heavily-doped area 38 is used as an ohmic contact. Thus, the second N-type strip-shaped heavily-doped area 38 is alternatively omitted.

Figure 19:
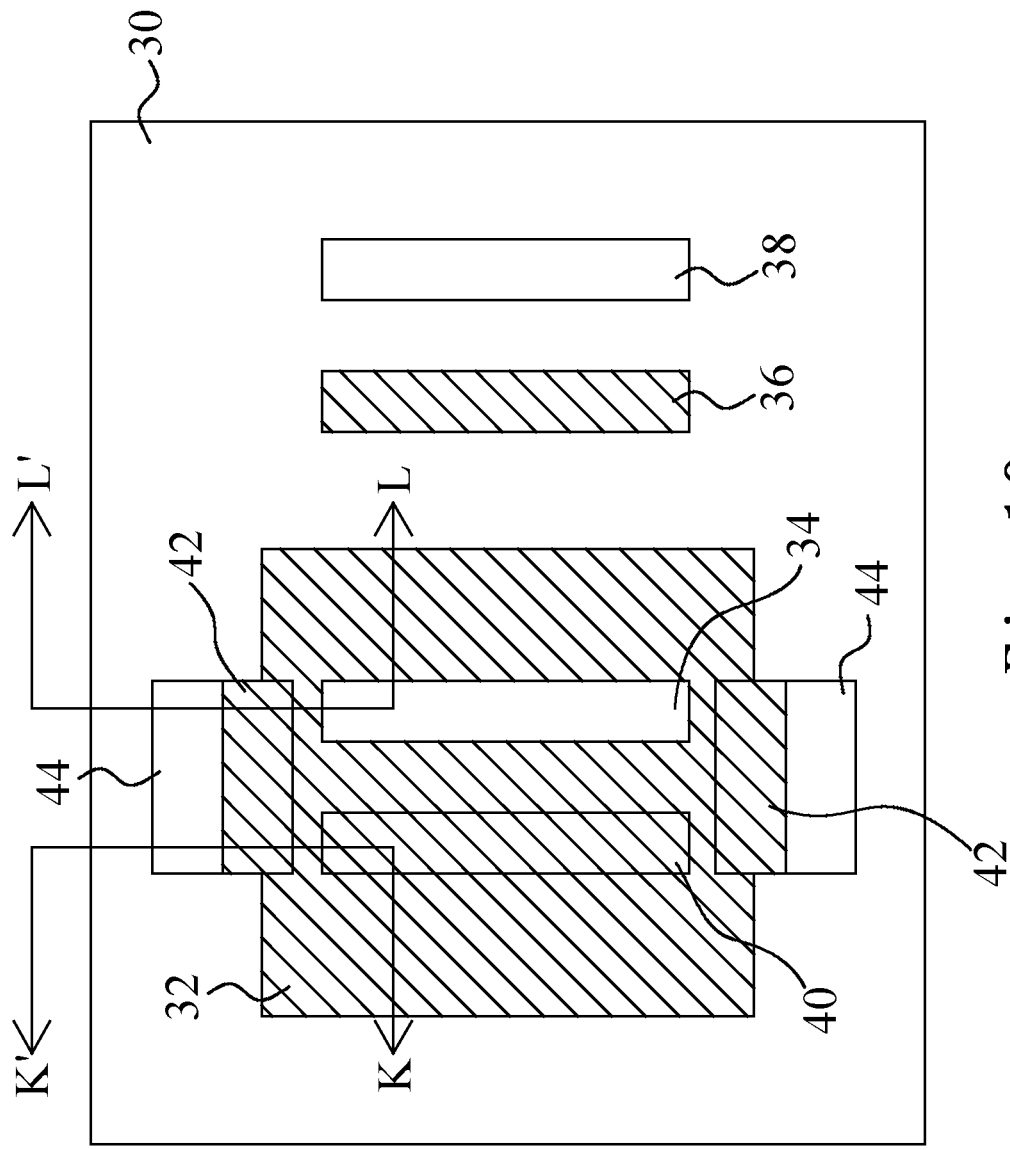
FIG. 19 is a layout schematically showing a silicon controlled rectifier according to the eighth embodiment of the present invention.
Figure 20:
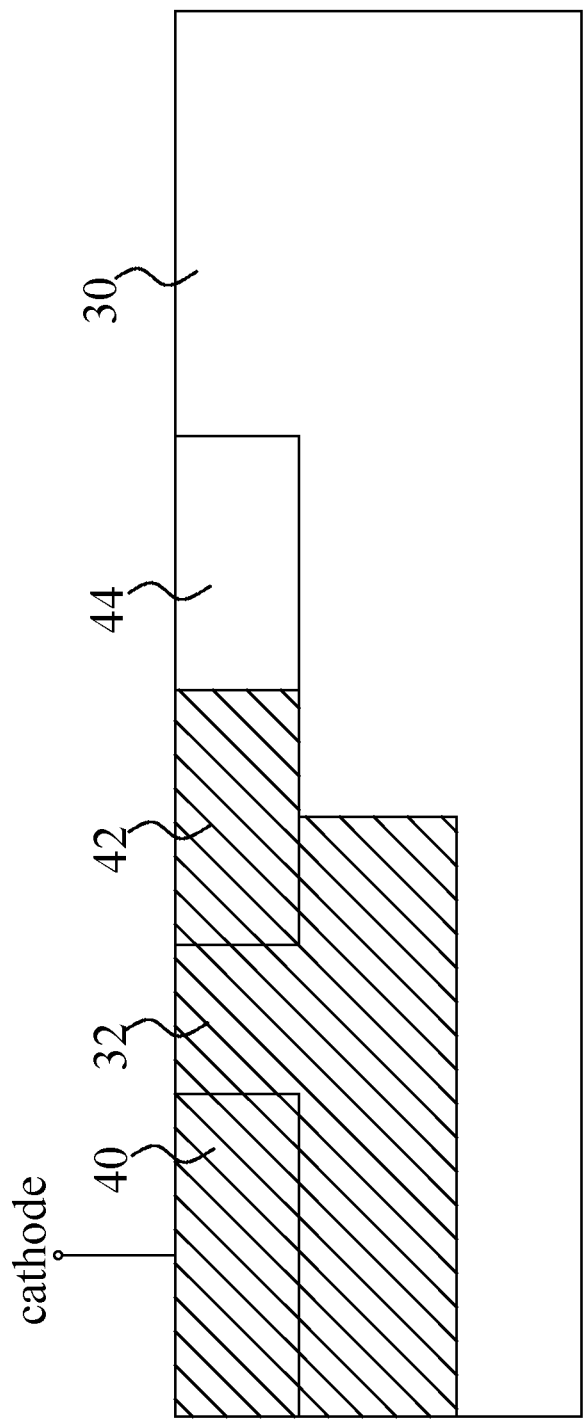
FIG. 20 is a sectional view taken along Line K-K' of FIG. 19.
Figure 21:
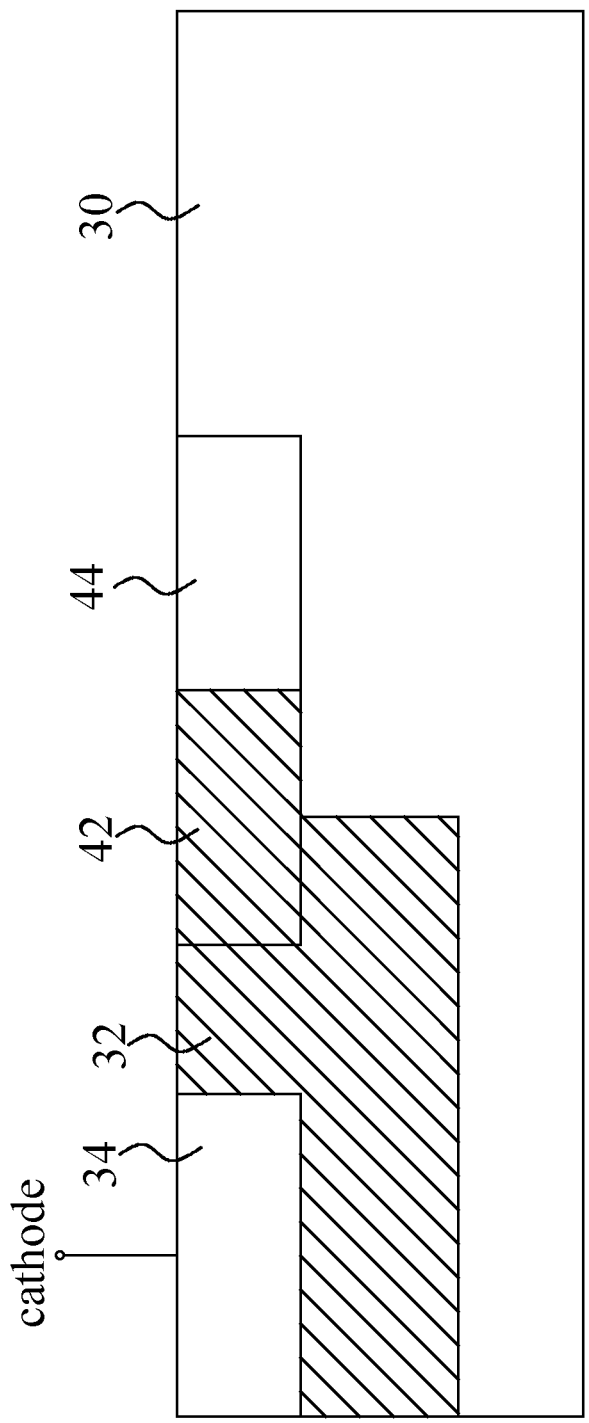
FIG. 21 is a sectional view taken along Line L-L' of FIG. 19.

Refer to FIG. 19, FIG. 20, and FIG. 21. The eighth embodiment of a SCR is introduced as follows. The eighth embodiment is different from the seventh embodiment in that the eighth embodiment further comprises at least one N-type heavily-doped area 44. In the eighth embodiment, the number of the N-type heavily-doped area 44 is two. The N-type heavily-doped areas 44 are arranged in the N-type substrate 30 to contact the P-type heavily-doped areas 42. The P-type heavily-doped area 42 is arranged between the N-type heavily-doped area 44 and the first N-type strip-shaped heavily-doped area 34. The P-type heavily-doped area 42 is arranged between the N-type heavily-doped area 44 and the second P-type strip-shaped heavily-doped area 40. The other technical features have been described previously so will not be reiterated.

Figure 22:
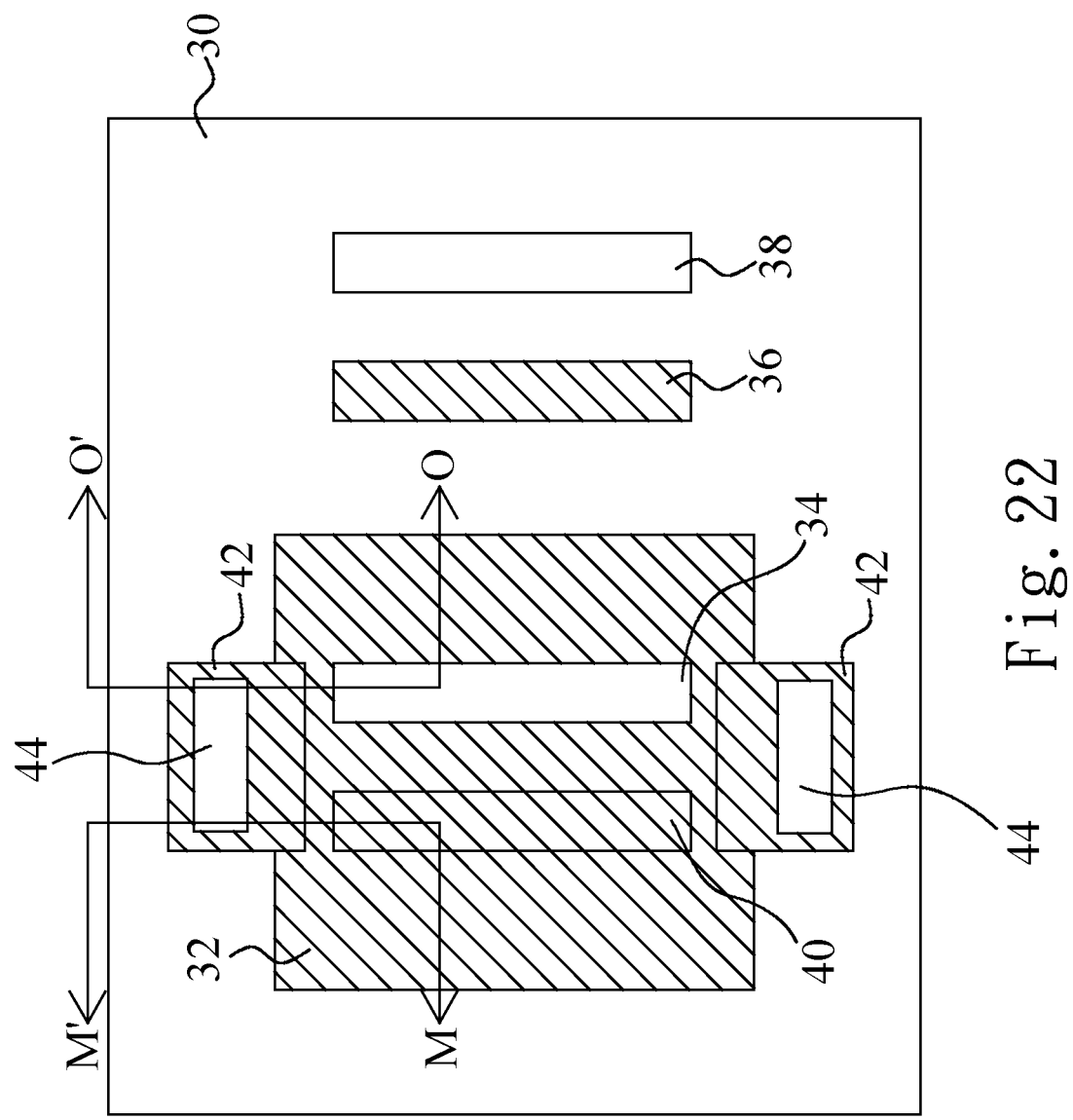
FIG. 22 is a layout schematically showing a silicon controlled rectifier according to the ninth embodiment of the present invention.
Figure 23:
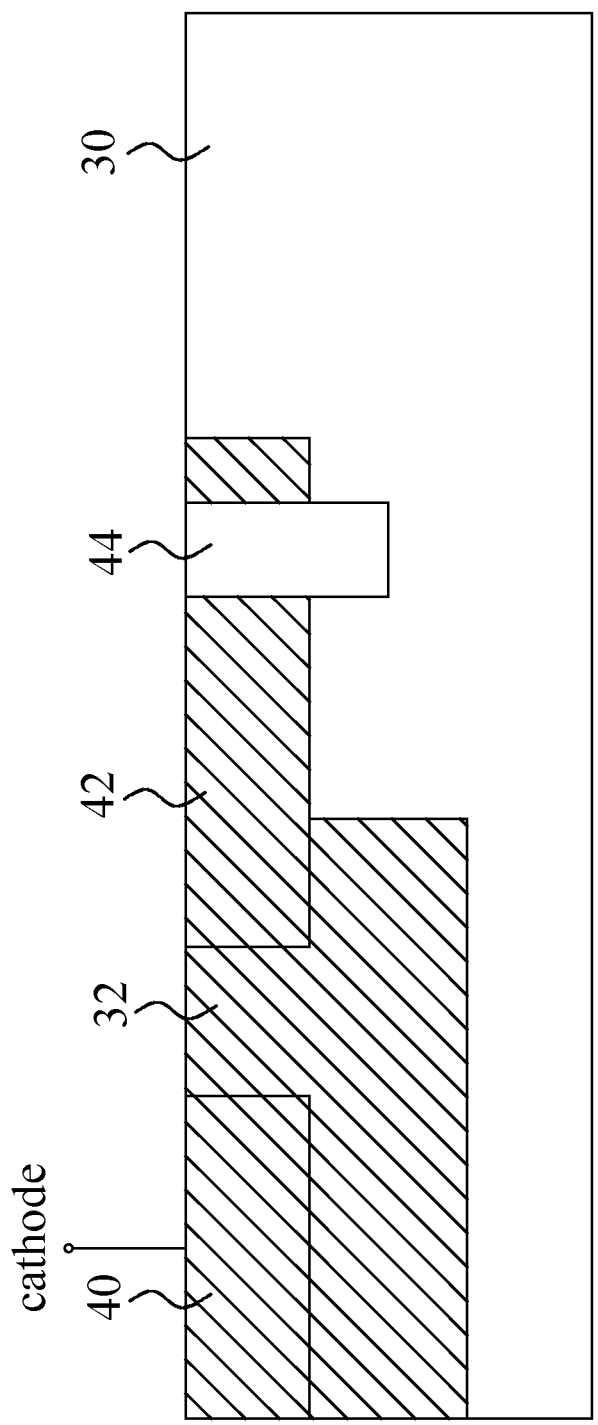
FIG. 23 is a sectional view taken along Line M-M' of FIG. 22.
Figure 24:
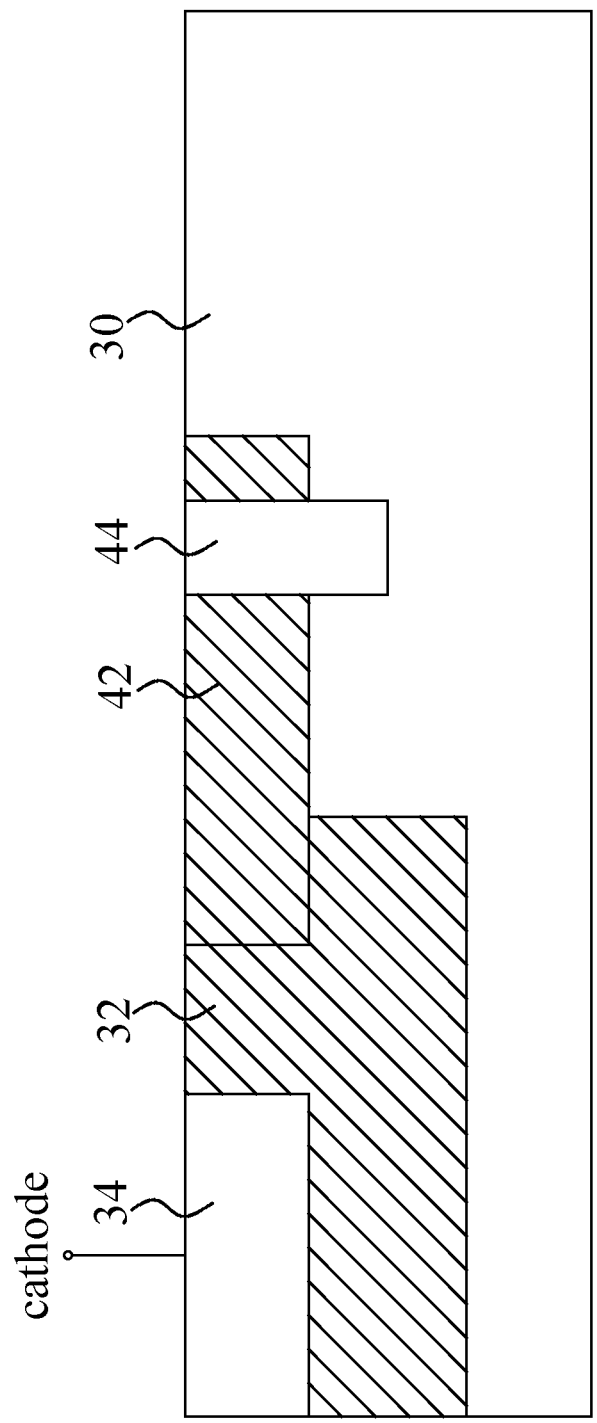
FIG. 24 is a sectional view taken along Line 0-0' of FIG. 22.

Refer to FIG. 22, FIG. 23, and FIG. 24. The ninth embodiment of a SCR is introduced as follows. The ninth embodiment is different from the seventh embodiment in that the ninth embodiment further comprises at least one N-type heavily-doped area 44. In the ninth embodiment, the number of the N-type heavily-doped area 44 is two. The N-type heavily-doped areas 44 are arranged in the N-type substrate 30 and respectively arranged in the P-type heavily-doped areas 42. The N-type heavily-doped areas 44 are deeper rather than the P-type heavily-doped areas 42. A part of the sidewall of the N-type heavily-doped area 44 is surrounded by the P-type heavily-doped area 42. The other technical features have been described previously so will not be reiterated.

Figure 25:
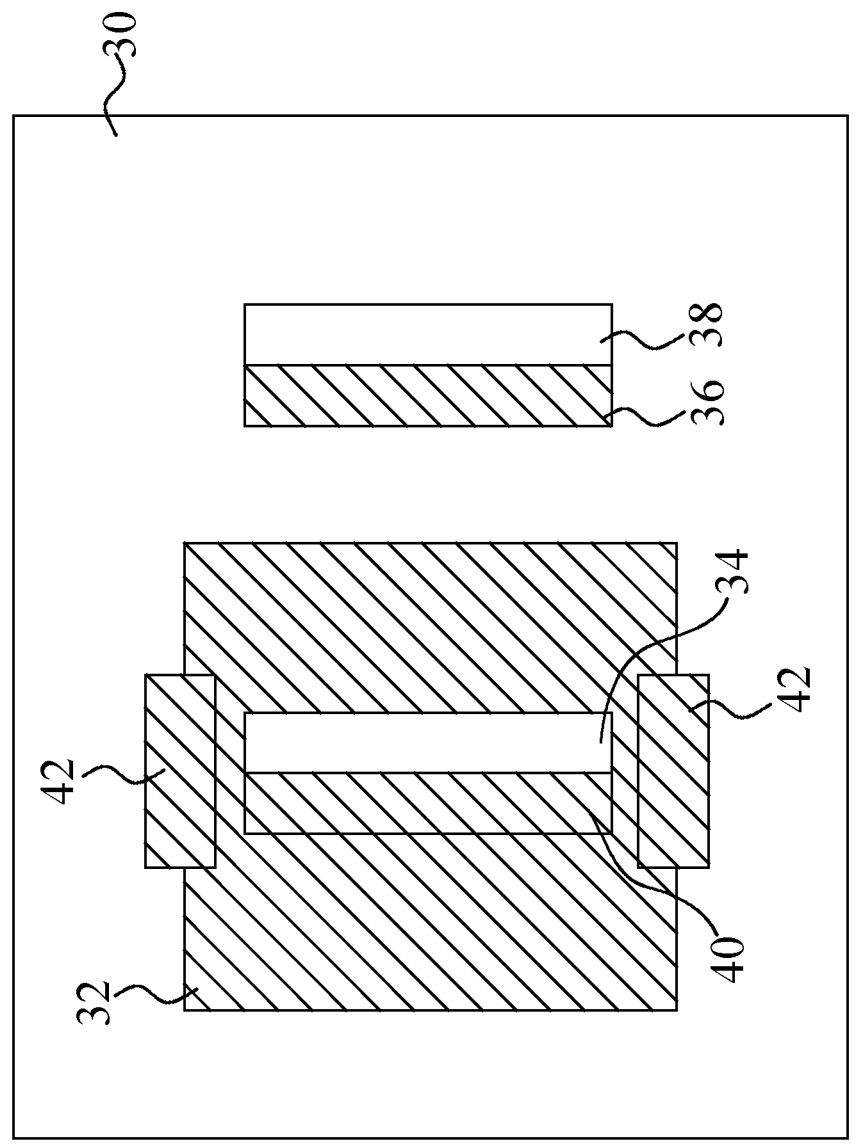
FIG. 25 is a layout schematically showing a silicon controlled rectifier according to the tenth embodiment of the present invention.

Refer to FIG. 25. The tenth embodiment of a SCR is introduced as follows. The tenth embodiment is different from the seventh embodiment in positions of the first N-type strip-shaped heavily-doped area 34, the first P-type strip-shaped heavily-doped area 36, the second N-type strip-shaped heavily-doped area 38, and the second P-type strip-shaped heavily-doped area 40. In the seventh embodiment, the first N-type strip-shaped heavily-doped area 34 and the first P-type strip-shaped heavily-doped area 36 respectively separate from the second P-type strip-shaped heavily-doped area 40 and the second N-type strip-shaped heavily-doped area 38. In the tenth embodiment, the first N-type strip-shaped heavily-doped area 34 and the first P-type strip-shaped heavily-doped area 36 respectively contact the second P-type strip-shaped heavily-doped area 40 and the second N-type strip-shaped heavily-doped area 38. The other technical features have been described previously so will not be reiterated.

Figure 26:
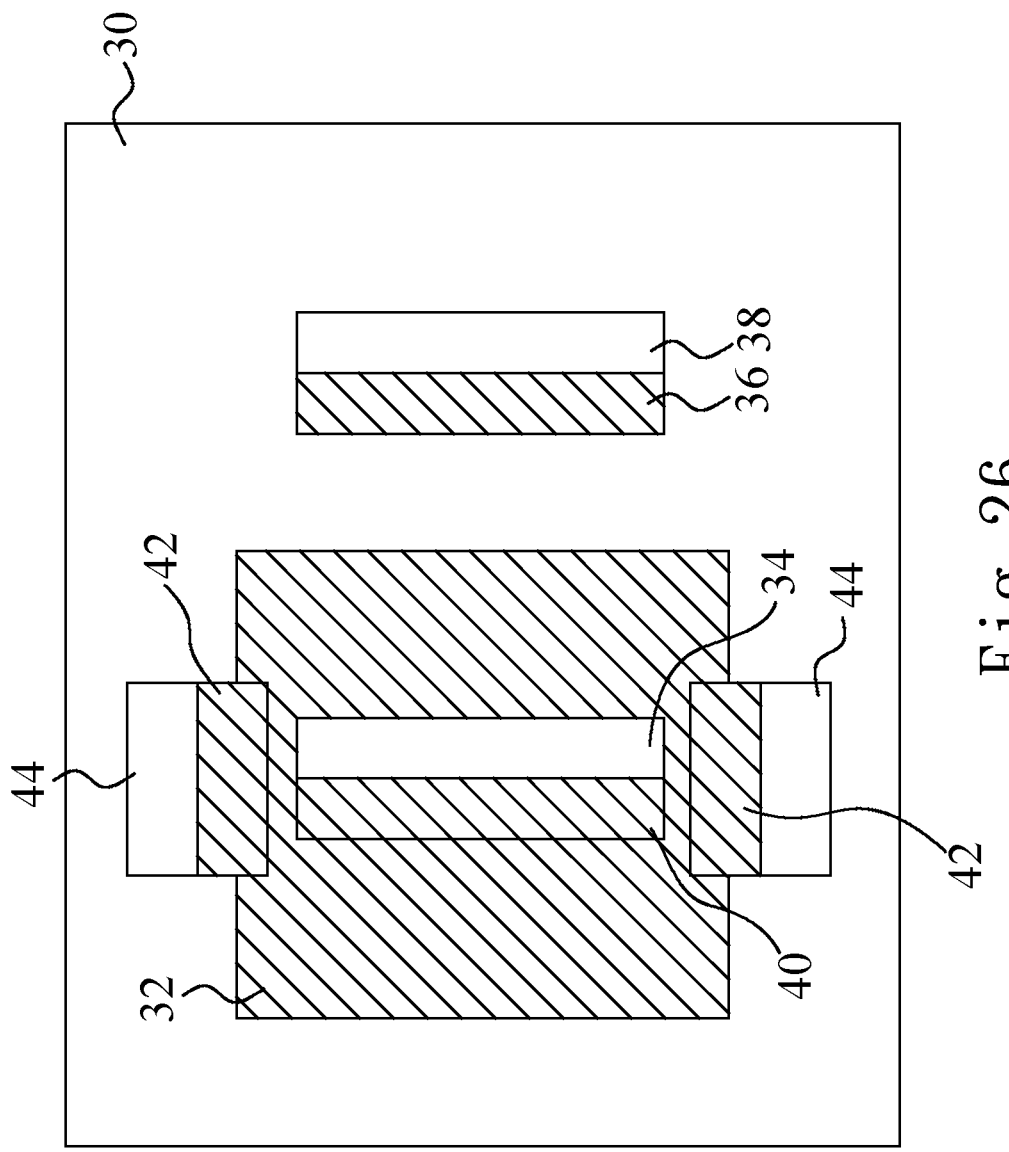
FIG. 26 is a layout schematically showing a silicon controlled rectifier according to the eleventh embodiment of the present invention.

Refer to FIG. 26. The eleventh embodiment of a SCR is introduced as follows. The eleventh embodiment is different from the eighth embodiment in positions of the first N-type strip-shaped heavily-doped area 34, the first P-type strip-shaped heavily-doped area 36, the second N-type strip-shaped heavily-doped area 38, and the second P-type strip-shaped heavily-doped area 40. In the eighth embodiment, the first N-type strip-shaped heavily-doped area 34 and the first P-type strip-shaped heavily-doped area 36 respectively separate from the second P-type strip-shaped heavily-doped area 40 and the second N-type strip-shaped heavily-doped area 38. In the eleventh embodiment, the first N-type strip-shaped heavily-doped area 34 and the first P-type strip-shaped heavily-doped area 36 respectively contact the second P-type strip-shaped heavily-doped area 40 and the second N-type strip-shaped heavily-doped area 38. The other technical features have been described previously so will not be reiterated.

Figure 27:
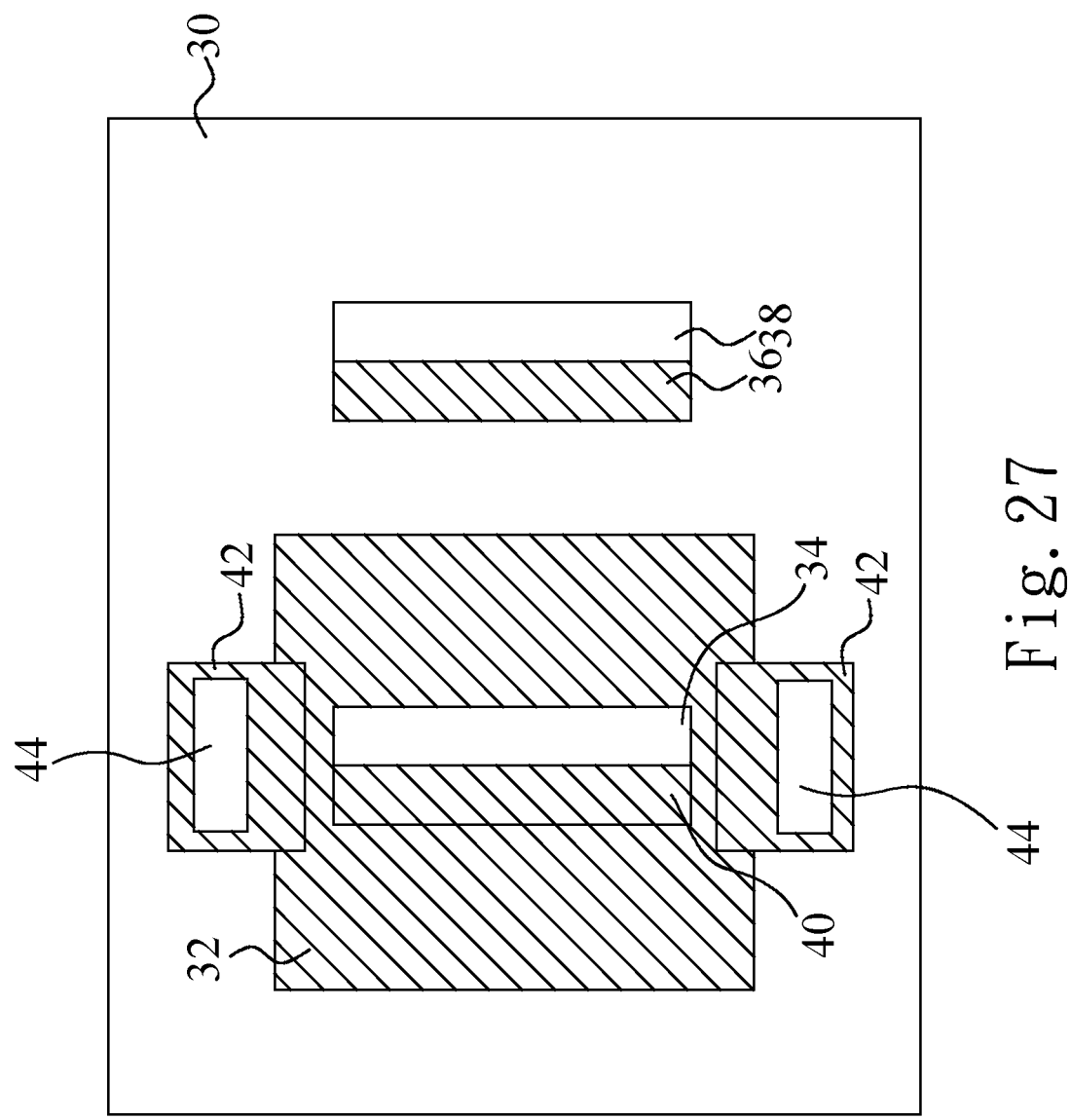
FIG. 27 is a layout schematically showing a silicon controlled rectifier according to the twelfth embodiment of the present invention.

Refer to FIG. 27. The twelfth embodiment of a SCR is introduced as follows. The twelfth embodiment is different from the ninth embodiment in positions of the first N-type strip-shaped heavily-doped area 34, the first P-type strip-shaped heavily-doped area 36, the second N-type strip-shaped heavily-doped area 38, and the second P-type strip-shaped heavily-doped area 40. In the ninth embodiment, the first N-type strip-shaped heavily-doped area 34 and the first P-type strip-shaped heavily-doped area 36 respectively separate from the second P-type strip-shaped heavily-doped area 40 and the second N-type strip-shaped heavily-doped area 38. In the twelfth embodiment, the first N-type strip-shaped heavily-doped area 34 and the first P-type strip-shaped heavily-doped area 36 respectively contact the second P-type strip-shaped heavily-doped area 40 and the second N-type strip-shaped heavily-doped area 38. The other technical features have been described previously so will not be reiterated.

In conclusion, the present invention arranges at least one N-type heavily-doped area or at least one P-type heavily-doped area outside the first P-type strip-shaped heavily-doped area and the first N-type strip-shaped heavily-doped area to reduce the surface area of the semiconductor substrate and enhance the ESD efficiency.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A silicon controlled rectifier comprising:
a P-type substrate;
an N-type doped well arranged in the P-type substrate;
a first P-type strip-shaped heavily-doped area arranged in the N-type doped well;
a first N-type strip-shaped heavily-doped area arranged in the P-type substrate, and the first N-type strip-shaped heavily-doped area is arranged in parallel to the first P-type strip-shaped heavily-doped area;
a second P-type strip-shaped heavily-doped area arranged in the P-type substrate and arranged in parallel to the first N-type strip-shaped heavily-doped area; and
at least one N-type heavily-doped area arranged in the P-type substrate and the N-type doped well, the at least one N-type heavily-doped area is arranged outside the first P-type strip-shaped heavily-doped area and the first N-type strip-shaped heavily-doped area and closer to the first P-type strip-shaped heavily-doped area rather than the first N-type strip-shaped heavily-doped area, and the at least one N-type heavily-doped area is not arranged between the first P-type strip-shaped heavily-doped area and the first N-type strip-shaped heavily-doped area;
wherein the at least one N-type heavily-doped area further comprises two N-type heavily-doped areas.

2. The silicon controlled rectifier according to claim 1, wherein the first P-type strip-shaped heavily-doped area is coupled to an anode, and the first N-type strip-shaped heavily-doped area and the second P-type strip-shaped heavily-doped area are coupled to a cathode.

3. The silicon controlled rectifier according to claim 1, wherein the P-type substrate is a P-type lightly-doped substrate and the N-type doped well is an N-type lightly-doped well.

4. The silicon controlled rectifier according to claim 1, wherein the second P-type strip-shaped heavily-doped area contacts the first N-type strip-shaped heavily-doped area.

5. The silicon controlled rectifier according to claim 1, further comprising a second N-type strip-shaped heavily-doped area arranged in the N-type doped well and arranged in parallel to the first P-type strip-shaped heavily-doped area, and the at least one N-type heavily-doped area is closer to the second N-type strip-shaped heavily-doped area rather than the first N-type strip-shaped heavily-doped area.

6. The silicon controlled rectifier according to claim 5, wherein the first P-type strip-shaped heavily-doped area and the second N-type strip-shaped heavily-doped area are coupled to an anode, and the first N-type strip-shaped heavily-doped area and the second P-type strip-shaped heavily-doped area are coupled to a cathode.

7. The silicon controlled rectifier according to claim 5, wherein the first P-type strip-shaped heavily-doped area contacts the second N-type strip-shaped heavily-doped area.

8. The silicon controlled rectifier according to claim 1, further comprising at least one P-type heavily-doped area arranged in the P-type substrate to contact the at least one N-type heavily-doped area, and the at least one N-type heavily-doped area is arranged between the at least one P-type heavily-doped area and the first P-type strip-shaped heavily-doped area.

9. The silicon controlled rectifier according to claim 1, further comprising at least one P-type heavily-doped area arranged in the P-type substrate and the at least one N-type heavily-doped area, the at least one P-type heavily-doped area is deeper rather than the at least one N-type heavily-doped area, and a part of a sidewall of the at least one P-type heavily-doped area is surrounded by the at least one N-type heavily-doped area.

10. A silicon controlled rectifier comprising:
an N-type substrate;
a P-type doped well arranged in the N-type substrate;
a first N-type strip-shaped heavily-doped area arranged in the P-type doped well;
a first P-type strip-shaped heavily-doped area arranged in the N-type substrate, and the first P-type strip-shaped heavily-doped area is arranged in parallel to the first N-type strip-shaped heavily-doped area;
a second P-type strip-shaped heavily-doped area arranged in the P-type doped well and arranged in parallel to the first N-type strip-shaped heavily-doped area; and
at least one P-type heavily-doped area arranged in the N-type substrate and the P-type doped well, the at least one P-type heavily-doped area is arranged outside the first N-type strip-shaped heavily-doped area and the first P-type strip-shaped heavily-doped area and closer to the first N-type strip-shaped heavily-doped area and the second P-type strip-shaped heavily-doped area rather than the first P-type strip-shaped heavily-doped area, and the at least one P-type heavily-doped area is not arranged between the first N-type strip-shaped heavily-doped area and the first P-type strip-shaped heavily-doped area.

11. The silicon controlled rectifier according to claim 10, wherein the first N-type strip-shaped heavily-doped area and the second P-type strip-shaped heavily-doped area are coupled to a cathode, and the first P-type strip-shaped heavily-doped area is coupled to an anode.

12. The silicon controlled rectifier according to claim 10, wherein the N-type substrate is an N-type lightly-doped substrate and the P-type doped well is a P-type lightly-doped well.

13. The silicon controlled rectifier according to claim 10, wherein the at least one P-type heavily-doped area further comprises two P-type heavily-doped areas.

14. The silicon controlled rectifier according to claim 10, wherein the second P-type strip-shaped heavily-doped area contacts the first N-type strip-shaped heavily-doped area.

15. The silicon controlled rectifier according to claim 10, further comprising a second N-type strip-shaped heavily-doped area arranged in the N-type substrate and arranged in parallel to the first P-type strip-shaped heavily-doped area.

16. The silicon controlled rectifier according to claim 15, wherein the first N-type strip-shaped heavily-doped area and the second P-type strip-shaped heavily-doped area are coupled to a cathode, and the first P-type strip-shaped heavily-doped area and the second N-type strip-shaped heavily-doped area are coupled to an anode.

17. The silicon controlled rectifier according to claim 15, wherein the first P-type strip-shaped heavily-doped area contacts the second N-type strip-shaped heavily-doped area.

18. The silicon controlled rectifier according to claim 10, further comprising at least one N-type heavily-doped area arranged in the N-type substrate to contact the at least one P-type heavily-doped area, and the at least one P-type heavily-doped area is arranged between the at least one N-type heavily-doped area and the first N-type strip-shaped heavily-doped area.

19. The silicon controlled rectifier according to claim 10, further comprising at least one N-type heavily-doped area arranged in the N-type substrate and the at least one P-type heavily-doped area, the at least one N-type heavily-doped area is deeper rather than the at least one P-type heavily-doped area, and a part of a sidewall of the at least one N-type heavily-doped area is surrounded by the at least one P-type heavily-doped area.

* * * * *